(12) United States Patent
Tsubomi et al.

(10) Patent No.: US 11,152,468 B2
(45) Date of Patent: Oct. 19, 2021

(54) SEMICONDUCTOR DEVICE

(71) Applicant: Tohoku University, Miyagi (JP)

(72) Inventors: Kunihiro Tsubomi, Miyagi (JP); Tetsuo Endoh, Miyagi (JP); Masakazu Muraguchi, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/089,421

(22) PCT Filed: Mar. 30, 2017

(86) PCT No.: PCT/JP2017/013250
§ 371 (c)(1),
(2) Date: Sep. 28, 2018

(87) PCT Pub. No.: WO2017/170867
PCT Pub. Date: Oct. 5, 2017

(65) Prior Publication Data
US 2019/0115430 A1    Apr. 18, 2019

(30) Foreign Application Priority Data

Mar. 31, 2016 (JP) .............................. JP2016-073752

(51) Int. Cl.
*H01L 29/10* (2006.01)
*H01L 29/417* (2006.01)
(Continued)

(52) U.S. Cl.
CPC .......... *H01L 29/1095* (2013.01); *H01L 21/76* (2013.01); *H01L 29/06* (2013.01);
(Continued)

(58) Field of Classification Search
None
See application file for complete search history.

(56) References Cited

U.S. PATENT DOCUMENTS

2001/0032999 A1   10/2001  Yoshida
2009/0008675 A1*   1/2009  Lu ...................... H01L 29/7394
                                                            257/141
(Continued)

FOREIGN PATENT DOCUMENTS

JP    H11340468 A   12/1999
JP    2005136150 A   5/2005
(Continued)

OTHER PUBLICATIONS

Supplementary European Search Report dated Nov. 6, 2019 in EP 17775401.7.
(Continued)

*Primary Examiner* — Robert K Carpenter
(74) *Attorney, Agent, or Firm* — Fox Rothschild LLP; Robert J. Sacco; Carol E. Thorstad-Forsyth

(57) ABSTRACT

Provided is a semiconductor device. A semiconductor device includes a substrate, a buffer layer provided on the substrate, a semiconductor layer provided on the buffer layer, a body region provided at a part of a surface layer of the semiconductor layer, a source region provided at a part of a surface layer of the body region, a drain region provided at a part of the surface layer of the semiconductor layer outside the body region, a gate insulating layer provided to extend from the surface layer of the body region to a predetermined depth, a gate electrode provided on the gate insulating layer, a source electrode provided on the source region, a drain electrode provided on the drain region, and an isolation region provided to extend from the surface layer of the semiconductor layer to above the predetermined depth.

24 Claims, 23 Drawing Sheets

(51) Int. Cl.
*H01L 29/78* (2006.01)
*H01L 29/423* (2006.01)
*H01L 21/76* (2006.01)
*H01L 29/06* (2006.01)

(52) U.S. Cl.
CPC .... *H01L 29/41766* (2013.01); *H01L 29/4238* (2013.01); *H01L 29/78* (2013.01); *H01L 29/7825* (2013.01)

(56) References Cited

U.S. PATENT DOCUMENTS

| | | | |
|---|---|---|---|
| 2010/0244125 | A1 | 9/2010 | Sonsky et al. |
| 2010/0289067 | A1* | 11/2010 | Mishra .............. H01L 29/66462 257/268 |
| 2013/0075790 | A1* | 3/2013 | Hirler ................. H01L 29/0619 257/194 |
| 2014/0203327 | A1* | 7/2014 | Pillarisetty ........ H01L 29/78618 257/192 |

FOREIGN PATENT DOCUMENTS

| | | |
|---|---|---|
| JP | 2006173357 A | 6/2006 |
| JP | 2010016284 A | 1/2010 |

OTHER PUBLICATIONS

Saito, W., et al., "Influence of Electric Field upon Current Collapse Phenomena and Reliability in High Voltage GaN-HEMTs," Proceedings of the 22nd International Symposium on Power Semiconductor Devices and ICs, Hiroshima.

Chu, R., et al., "1200-V Normally Off GaN-on-Si Field-Effect Transistors with Low Dynamic On-Resistance," IEEE Electron Device Letters, vol. 32, No. 5, May 2011.

Saito, W., et al., "Suppression of Dynamic On-Resistance Increase and Gate Charge Measurements in High-Voltage GaN-HEMTs with Optimized Field-Plate Structure," IEEE Transactions on Electron Devices, vol. 54, No. 8, Aug. 2007.

\* cited by examiner

SEMICONDUCTOR DEVICE

CROSS REFERENCE TO RELATED APPLICATION

The present application is a 371 national stage entry of International Patent Application (PCT) No. PCT/JP2017/013250 filed on Mar. 30, 2017, which claims priority to Japanese Patent Application No. 2016-073752 filed on Mar. 31, 2016. Both of the aforementioned applications are incorporated herein by reference in their entireties.

TECHNICAL FIELD

The present invention relates to a semiconductor device which has a higher withstand voltage and controls current decrease.

BACKGROUND ART

III-V compound semiconductors are promising as power semiconductors and are used as, e.g., HEMT (High Electron Mobility Transistor) power devices. FIG. 18 is a cross-sectional view of a conventional nitride semiconductor device. A semiconductor device 500 having a HEMT structure includes a substrate 51 for semiconductor growth, a nitride semiconductor layer 52 which is provided on the substrate 51 for semiconductor growth, and a nitride-based electron supply layer 53 which is provided on the nitride semiconductor layer 52, and includes a gate electrode 54, a source electrode 55, and a drain electrode 56, and a surface protective layer 57 on the nitride-based electron supply layer 53. The nitride semiconductor layer 52 is made of GaN, and the nitride-based electron supply layer 53 is made of AlGaN.

FIG. 19 is a graph illustrating an electric field strength distribution of the nitride semiconductor device 500 illustrated in FIG. 18. The horizontal axis represents position while the vertical axis represents electric field strength. In the nitride semiconductor device 500, the gate electrode 54 and the source electrode 55 include field plates to prevent electric field concentration on an edge portion of the gate electrode 54. As indicated by a solid line in FIG. 19, electric field strength is more evenly distributed than in a dotted distribution for a case without a field plate (w/o FP), and the nitride semiconductor device 500 does not have a sharp electric field strength distribution. This is described in detail in Non Patent Literatures 1 to 3.

CITATION LIST

Non Patent Literature

Patent Literature 1: Wataru Saito, Tomohiro Nitta, Yorito Kakiuchi, Yasunobu Saito, Takao Noda, Hidetoshi Fujimoto, Akira Yoshioka, and Tetsuya Ohno, "Influence of Electric Filed upon Current Collapse Phenomena and Reliability in High Voltage GaN-HEMTs", Proceedings of The 22nd International Symposium on Power Semiconductor Device & ICs, Hiroshima 9-1, pp. 339-342

Non Patent Literature 2: Rongming Chu, Andrea Corrion, Mary Chen, Ray Li, Danny Wong, Daniel Zehnder, Brian Hughes, and Karim Boutros, "1200-V Nomally Off GaN-on-Si Field-Effect Transistors With Low Dynamic ON-Resistance", IEEE ELECTRON DEVICE LETTERS, VOL. 32, NO. 5, MAY 2011, pp. 632-634

Non Patent Literature 3: Wataru Saito, Tomohiro Nitta, Yorito Kakiuchi, Yasunobu Saito, Kunio Tsuda, Ichiro Omura, and Masakazu Yamaguchi, "Supperssion of Dynamic On-Resistance Increase and Gate Charge Measurements in High-Voltage GaN-HEMTs With Optimized Field-Plate Structure", IEEE TRANSACTIONS ON ELECTRON DEVICE, VOL. 54, NO. 8, AUGUST 2007, pp. 1825-1830

SUMMARY OF INVENTION

Technical Problem

The field plates reduce the electric field, but the electric field concentrates on an edge portion of the gate electrode 54. This causes the problem of a decrease of withstand voltage. In the case of arranging a multi-step field plate, a large number of process steps are necessary, and miniaturization is difficult.

A current path extends from the drain electrode 56 via the nitride-based electron supply layer 53 and an interface between the nitride-based electron supply layer 53 and the nitride-based semiconductor layer 52 and reaches the nitride-based electron supply layer 53 and the source electrode 55. If a high voltage is applied to the drain electrode 56, a high electric field is produced near a gate edge portion on a drain side, and electron trapping occurs at an interface between the nitride-based electron supply layer 53 and the surface protective layer 57 or in the nitride-based semiconductor layer 53. Thus, repetition of turning-on and turning-off of a gate causes current decrease due to the presence of electron-trapping sites in the current path, therefore a large current cannot flow.

Under the circumstances, it is an object of the present invention to provide a semiconductor device which has a higher withstand voltage and controls current decrease.

Solution to Problem

The present invention has the following concepts.

[1] A semiconductor device including
a substrate,
a buffer layer provided on the substrate,
a semiconductor layer provided on the buffer layer,
a body region provided at a part of a surface layer of the semiconductor layer,
a source region provided at a part of a surface layer of the body region,
a drain region provided at a part of the surface layer of the semiconductor layer outside the body region,
a gate insulating layer provided to extend from the surface layer of the body region to a predetermined depth,
a gate electrode provided on the gate insulating layer,
a source electrode provided on the source region,
a drain electrode provided on the drain region, and
an isolation region provided to extend from the surface layer of the semiconductor layer to above the predetermined depth, the isolation region isolating the body region from the drain region.

[2] The semiconductor device according to [1] described above, wherein the gate electrode is formed to extend from the source region to a predetermined depth such that the gate electrode reaches the semiconductor layer.

[3] The semiconductor device according to [1] described above, wherein the gate electrode is formed to extend from the source region to a predetermined depth through the semiconductor layer such that the gate electrode reaches the buffer layer.

[4] The semiconductor device according to any one of [1] to [3] described above, wherein the isolation region is formed to extend from the surface layer of the semiconductor layer to a depth deeper than the body region and not to reach the buffer layer.

[5] The semiconductor device according to any one of [1] to [4] described above, wherein the buffer layer is insulating or semi-insulating.

[6] The semiconductor device according to any one of [1] to [5] described above, wherein the semiconductor layer contains an impurity of N-type or P-type and is electroconductive.

[7] The semiconductor device according to any one of [1] to [6] described above, wherein the semiconductor layer and the body region constitute a diode, and the diode blocks a reverse current from flowing easily when a reverse bias is applied between the drain electrode and the source electrode.

[8] The semiconductor device according to any one of [1] to [7] described above, wherein the body region has a carrier density higher than a carrier density of the semiconductor layer.

[9] The semiconductor device according to any one of [1] to [8] described above, wherein the semiconductor layer, the body region, and the source region constitute an NPN or a PNP.

[10] The semiconductor device according to any one of [1] to [9] described above, wherein the gate insulating layer is adjacent to the source region and the body region and is not provided between the body region and the drain region.

[11] The semiconductor device according to any one of [1] to [10] described above, wherein the source region and the drain region have carrier densities higher than the carrier density of the semiconductor layer.

[12] The semiconductor device according to any one of [1] to [11] described above, wherein when a voltage is applied to the gate electrode such that an inversion layer is formed in the body region, a current path is formed to extend from the drain electrode, to a region below the isolation region of the semiconductor layer, then to the body region, and then to the source electrode.

[13] The semiconductor device according to any one of [1] to [12] described above, wherein the substrate, the buffer layer, and the semiconductor layer block a reverse current from flowing when a reverse bias is applied between the drain electrode and the substrate.

[14] The semiconductor device according to any one of [1] to [13] described above, wherein
the body region, the gate electrode, the source region, and the drain region constitute a transistor,
wherein a plurality of the gate insulating layers are iteratively provided in a plurality of regions, and a plurality of the body regions, a plurality of the source regions, and a plurality of the drain electrodes are provided between each adjacent two of the gate insulating layers, and
wherein the gate insulating layer and the buffer layer isolate the adjacent transistor.

[15] An integrated device including a plurality of semiconductor devices according to [14] described above arranged on a semiconductor device basis, wherein the plurality of semiconductor devices are separated by the gate insulating layer on a per-unit basis.

Advantageous Effects of Invention

According to the present invention, the gate insulating layer is provided to extend from the surface layer of the source region through the semiconductor layer and reach, for example, the buffer layer, and the gate electrode is provided so as to be in contact with the gate insulating layer. The body region is provided on the semiconductor layer, the source region is provided in the body region, and the isolation region is provided between the body region and the drain region. Thus, the gate insulating layer and the isolation region form capacitors, the semiconductor region and the body region form a diode, and a leakage current does not flow easily between drain and gate and between drain and source in terms of structure. Even if a voltage to the gate electrode is turned on or off, electron trapping is unlikely to occur in the buffer layer. Since electron trapping does not occur in the buffer layer even upon application of a bias to the drain electrode, current does not reduce. Additionally, since depletion regions are formed in the semiconductor layer between the drain region and the substrate, between the drain region and the source region, and between the drain region and the gate electrode, and electric field strength is distributed to be low overall, a local electric field is unlikely to be produced, and a withstand voltage is high. As described above, according to the present invention, a semiconductor device, which has a higher withstand voltage and controls current decrease and through which a large amount of current flows, can be provided.

BRIEF DESCRIPTION OF DRAWINGS

FIG. 100 shows an example of implementation to an external terminal in the semiconductor device illustrated in FIG. 10A.

DESCRIPTION OF EMBODIMENTS

Figure 1:
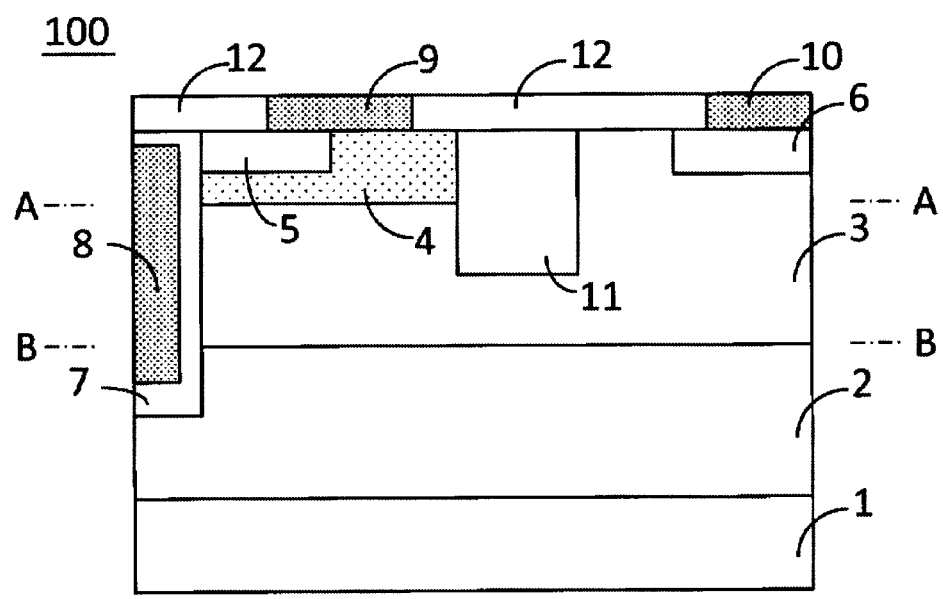
FIG. 1 is a cross-sectional view illustrating a basic configuration of a semiconductor device according to an embodiment of the present invention.

Some embodiments of the present invention will be described below in detail with reference to the drawings. FIG. 1 is a cross-sectional view illustrating a basic configuration of a semiconductor device according to the embodiment of the present invention. A semiconductor device 100 according to the embodiment of the present invention has the basic configuration illustrated in FIG. 1 and includes a substrate 1, a buffer layer 2 which is provided on the substrate 1, a semiconductor layer 3 which is provided on the buffer layer 2, a body region 4 which is provided at a part of a surface layer of the semiconductor layer 3, a source region 5 which is provided at a part of a surface layer of the body region 4, a drain region 6 which is provided at a part of the surface layer of the semiconductor layer 3 outside the body region 4, a gate insulating layer 7 which is provided to extend from the surface layer of the body region 4 to a predetermined depth, a gate electrode 8 which is provided on the gate insulating layer 7, a source electrode 9 which is provided on the source region 5, a drain electrode 10 which is provided on the drain region 6, and an isolation region 11 which is provided to extend from the surface layer of the semiconductor layer 3 to above the predetermined depth and isolates the body region 4 from the drain region 6.

In the semiconductor device 100, the isolation region 11 is provided to extend from the surface layer of the semiconductor layer 3 to above the predetermined depth or, more specifically, to extend to a depth deeper than an interface between the body region 4 and the semiconductor layer 3 and not to reach the buffer layer 2. As long as the isolation region 11 falls within this range, sufficient current can flow from a lower end of the isolation region 11 to an interface between the buffer layer 2 and the semiconductor layer 3.

The substrate 1 is a substrate having a lattice constant different from that of the semiconductor layer 3, and, for example, an electroconductive substrate, an Si substrate, an SiC substrate, or the like is used as the substrate 1. Any substrate may be used as long as the buffer layer 2 can cause crystal growth of the semiconductor layer 3. The substrate 1 may be called a substrate for semiconductor growth.

The buffer layer 2 is provided to match the lattice constant of the substrate 1 to that of the semiconductor layer 3. The semiconductor layer 3 has the lattice constant different from that of the substrate 1. The semiconductor layer 3 contains an impurity of either P-type or N-type and is highly electroconductive. The semiconductor layer 3 preferably has an electroconductivity in the 0.1- to 100-Ωcm range. The semiconductor layer 3 may be called an electroconductive semiconductor layer or a drift layer. In contrast, the buffer layer 2 is insulating or semi-insulating. The buffer layer 2 preferably has a resistivity not less than $1 \times 10^5$ Ωcm. The buffer layer 2 may be called an insulating semiconductor layer. The semiconductor device 100 of MIS type is configured such that current does not flow easily from the semiconductor layer 3 to the buffer layer 2. Materials for the buffer layer 2 include GaN and AlGaN. The material for the semiconductor layer 3 is a III-V material and preferably contains Ga. Examples of the material include GaN.

Ions, such as Si ions in the case of n-type or Mg ions in the case of p-type, are implanted in the body region 4 such that the body region 4 has a carrier density higher than that of the semiconductor layer 3. The source region 5 and the drain region 6 have carrier densities higher than that of the semiconductor layer 3.

For example, the carrier density of the semiconductor layer 3 ranges from about $1 \times 10^{14}$ to about $1 \times 10^{17}/cm^3$, the carrier density of the body region 4 ranges from about $1 \times 10^{16}$ to about $1 \times 10^{18}/cm^3$, and carrier densities of the source region 5 and the drain region 6 as contact regions range from about $1 \times 10^{18}$ to about $1 \times 10^{20}/cm^3$.

The gate insulating layer 7 is formed to extend beyond the interface between the buffer layer 2 and the semiconductor layer 3 to the buffer layer 2, and the gate electrode 8 is formed to extend in a depth direction inside the gate insulating layer 7. The gate insulating layer 7 is made of an oxide or a nitride, such as $SiO_2$ or SiN. Any material may be used as the material for the gate electrode 8 as long as the material is highly compatible with the gate insulating layer 7. Electroconductive examples of the material include metals and polysilicon. If the gate insulating layer is made of $SiO_2$, the gate electrode 8 is made of polysilicon. In the semiconductor device 100, the gate electrode 8 is provided to have such a length in the depth direction that the gate electrode 8 extends from the source region 5 to at least the interface between the buffer layer 2 and the semiconductor layer 3. The gate electrode 8 is preferably provided to be deeper than the interface between the buffer layer 2 and the semiconductor layer 3, more preferably provided to reach the substrate 1. The gate insulating layer 7 and the gate electrode 8 as described above have a trench gate.

The source electrode 9 is provided so as to lie astride both the source region 5 and the body region 4. In contrast, the drain electrode 10 is provided so as to be in contact only with a part of the drain region 6. This is to prevent punch-through even if the semiconductor layer 3 is depleted. The source electrode 9 is in ohmic contact with the source region 5, and the drain electrode 10 is in ohmic contact with the drain region 6.

As illustrated in FIG. 1, the isolation region 11 is provided between the body region 4 and the drain region 6 to isolate the body region 4 from the drain region 6. The isolation relieves a horizontal electric field from the drain electrode 10 side at the interface between the body region 4 and the semiconductor layer 3. This allows shortening of a horizontal distance between the body region 4 and the drain region 6. The isolation region 11 is made of a material wider in band gap and higher in dielectric breakdown electric field strength than that for the semiconductor layer 3. More specifically, the isolation region 11 is made of an insulating material, such as $SiO_2$, SiN, or $Al_2O_3$. The depth and width of the isolation region 11 are set on the basis of a withstand voltage of the material, and the isolation region 11 is provided such that a lower surface thereof is deeper than the interface between the body region 4 and the semiconductor layer 3.

In the semiconductor device 100 illustrated in FIG. 1, a protective layer 12 is formed over an entire surface layer of the gate insulating layer 7, a part of a surface layer of the source region 5, a part of the surface layer of the body region 4, an entire surface layer of the isolation region 11, the surface layer of the semiconductor layer 3, and a part of a surface layer of the drain region 6. The protective layer 12 is made of a passivation material, such as SiN or $SiO_2$.

Figure 2:
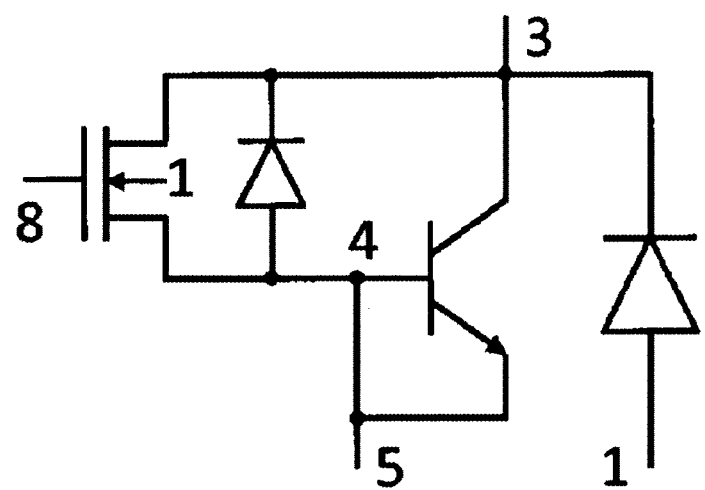
FIG. 2 illustrates an equivalent circuit of the semiconductor device illustrated in FIG. 1.

FIG. 2 is a diagram illustrating an equivalent circuit of the semiconductor device illustrated in FIG. 1. Numerals in the equivalent circuit correspond to reference numerals for the components illustrated in FIG. 1. A diode is formed between the substrate 1 and the semiconductor layer 3, and a diode is formed between the body region 4 and the semiconductor layer 3. With the diodes, a reverse current does not flow easily even if a reverse bias is applied between the drain electrode 10 and the source electrode 9. The semiconductor layer 3, the body region 4, and the source region 5 form a transistor, and the gate electrode 8, the substrate 1, the semiconductor layer 3, and the body region 4 form a transistor. Even if a reverse bias is applied between the drain electrode 10 and the substrate 1, a reverse current does not flow due to the substrate 1, the buffer layer 2, and the semiconductor layer 3.

The semiconductor device 100 according to the embodiment of the present invention has the following characteristic configuration. The gate insulating layer 7 is provided to extend from the surface layer of the source region 5 via the semiconductor layer 3 and reach at least the buffer layer 2, and the gate electrode 8 is provided so as to be in contact with the gate insulating layer 7. Additionally, the body region 4 is provided on the semiconductor layer 3, the source region 5 is provided on the body region 4, and the isolation region 11 is provided between the body region 4 and the drain region 6. Thus, the gate insulating layer 7 and the isolation region 11 form capacitors, and the semiconductor layer 3 and the body region 4 form a diode, which provides a structure in which a leakage current does not flow easily between drain and gate and between source and gate. Even if a high bias is applied to the drain electrode 10, electron trapping is unlikely to occur in the buffer layer 2. Since current is unlikely to decrease even if a bias is applied to the drain electrode 10, a large amount of current flows. Depletion regions are formed in the semiconductor layer 3 between the drain region 6 and the substrate 1, between the drain region 6 and the source region 5, and between the drain region 6 and the gate electrode 8, which allows a reduction in the amount of increase in vertical electric field. Since electric field strength is distributed to be low overall, a local electric field is unlikely to be produced, and a withstand voltage is high.

Figure 3:
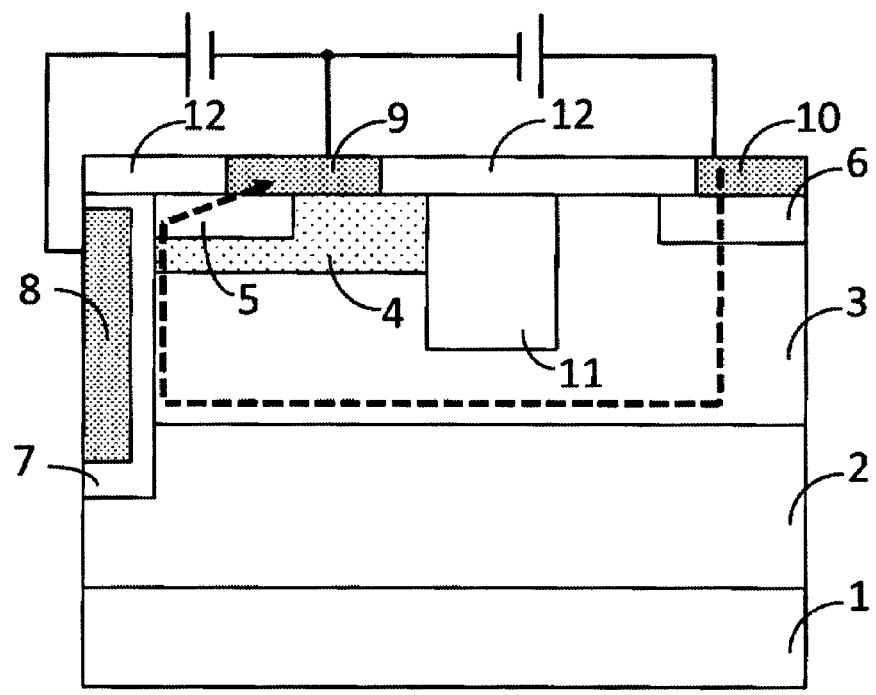
FIG. 3 is a view illustrating a current path in the semiconductor device illustrated in FIG. 1.

FIG. 3 is a view illustrating a current path in the semiconductor device illustrated in FIG. 1. The semiconductor device 100 illustrated in FIG. 1 is configured such that the semiconductor layer 3 is electroconductive and such that the buffer layer 2 for lattice matching is insulating or semi-insulating. With this configuration, current flows downward from the drain region 6 inside the semiconductor layer 3, flows through the semiconductor layer 3 toward the gate electrode 8 side, and flows to the source region 5 via the body region 4. Since the gate electrode 8 is provided to extend to such a depth that the gate electrode 8 reaches the buffer layer 2, even if electron trapping due to electric field concentration occurs in the buffer layer 2 near an edge portion of the gate electrode 8, the current path is not much affected. A low-current phenomenon due to current collapse can be minimized.

Now, what an electric field is like when a voltage is applied to the drain electrode 10 in the semiconductor device 100 will be described.

Figure 4A:
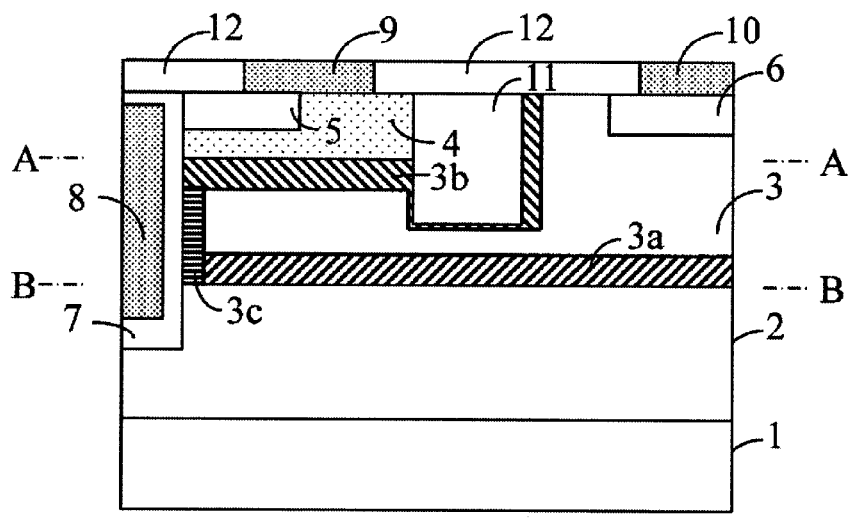
FIG. 4A is a view for explaining a depletion phenomenon when a low voltage is applied to a drain electrode in the semiconductor device illustrated in FIG. 1.
Figure 4B:
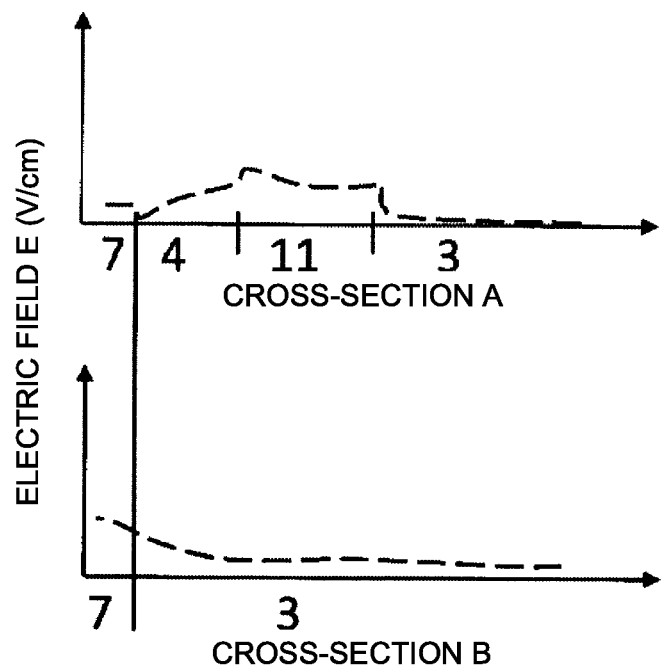
FIG. 4B shows charts illustrating electric field strength distributions in cross-section taken along line A-A and in cross-section taken along line B-B in FIG. 4A.

FIG. 4A is a view for explaining a depletion phenomenon when a low voltage is applied to the gate electrode in the semiconductor device illustrated in FIG. 1. FIG. 4B shows charts illustrating electric field strength distributions in cross-section taken along line A-A and in cross-section taken along line B-B in FIG. 4A. The horizontal axis in FIG. 4B represents position while the vertical axis represents electric field strength (V/cm). Numerals illustrated under the horizontal axis denote reference numerals illustrated in FIG. 4A. The low voltage here refers to, for example, a voltage which is far lower than the withstand voltage and is about several tens V.

When a voltage is applied to the drain electrode 10, a depletion layer 3a is formed in the semiconductor layer 3 between the drain region 6 and the substrate 1, a depletion layer 3b is formed in the semiconductor layer 3 between the drain region 6 and the source region 5, and a depletion layer 3c is formed in the semiconductor layer 3 between the drain region 6 and the gate electrode 8. The depletion layers 3a, 3b, and 3c are thin. In cross-section A, the electric field is high in the isolation region 11 and decreases along the semiconductor layer 3 and the body region 4. In cross-section B, the electric field is high in the gate insulating layer 7 and decreases along the semiconductor layer 3.

Figure 5A:
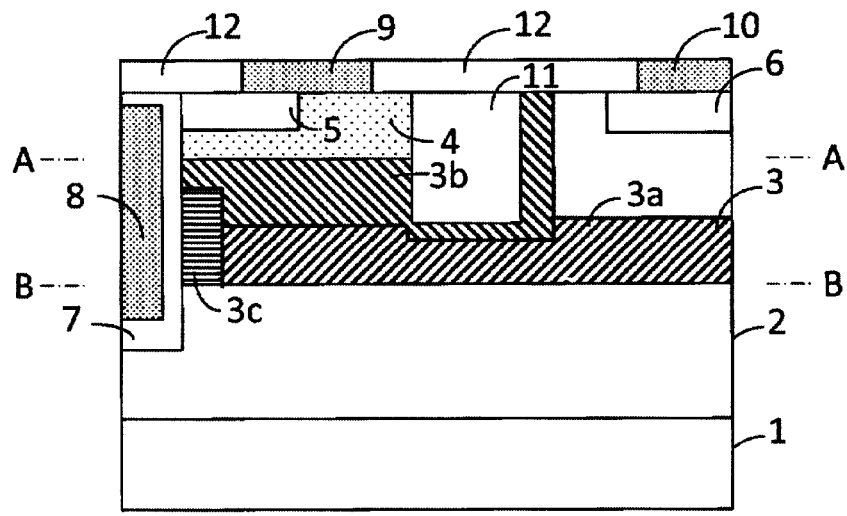
FIG. 5A is a view for explaining a depletion phenomenon when a medium voltage is applied to the drain electrode in the semiconductor device illustrated in FIG. 1.
Figure 5B:
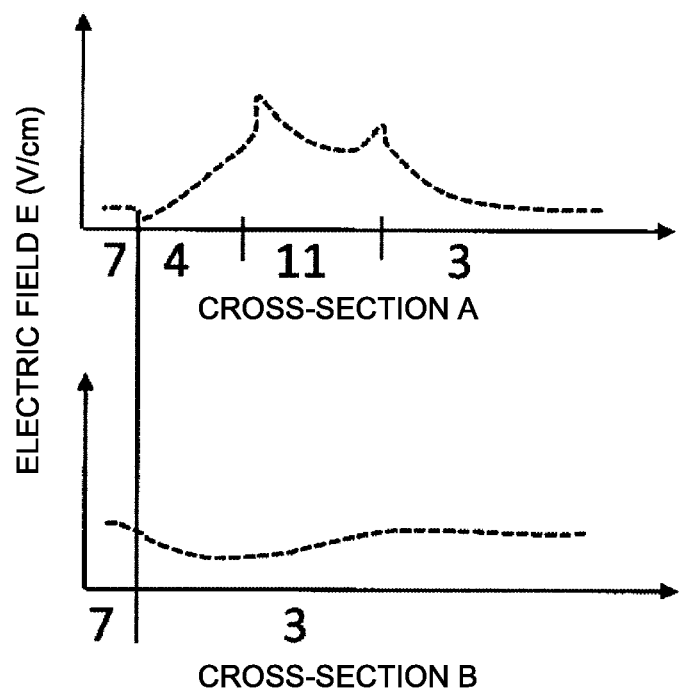
FIG. 5B is charts illustrating electric field strength distributions in cross-section taken along line A-A and in cross-section taken along line B-B in FIG. 5A.

FIG. 5A is a view for explaining a depletion phenomenon when a medium voltage is applied to the drain electrode in the semiconductor device illustrated in FIG. 1. FIG. 5B shows charts illustrating electric field strength distributions in cross-section taken along line A-A and in cross-section taken along line B-B in FIG. 5A. The horizontal axis in FIG. 5B represents position while the vertical axis represents electric field strength (V/cm). Numerals illustrated under the horizontal axis denote reference numerals illustrated in FIG. 5A. The medium voltage here refers to a voltage about half of the withstand voltage.

When a voltage to be applied to the drain electrode 10 is increased, the depletion layers 3a, 3b, and 3c become thicker. In cross-section A, the electric field is high particularly at boundaries between the isolation region 11 and a peripheral region, i.e., a boundary between the isolation region 11 and the semiconductor layer 3 and a boundary between the isolation region 11 and the body region 4. The isolation region 11 can relieve the electric field at the interface between the semiconductor layer 3 and the body region 4. If the substrate 1 is grounded, a depletion phenomenon from the substrate 1 allows further relief of the electric field at the interface between the semiconductor layer 3 and the body region 4. With the substrate 1 and the body region 4, electric field concentration hardly occurs at an edge portion of the gate electrode 8.

Figure 6A:
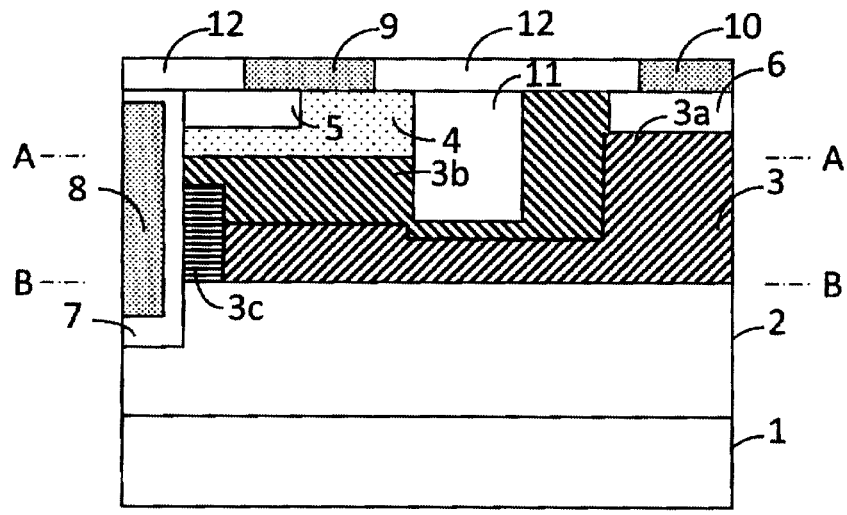
FIG. 6A is a view for explaining a depletion phenomenon when a high voltage is applied to the drain electrode in the semiconductor device illustrated in FIG. 1.
Figure 6B:
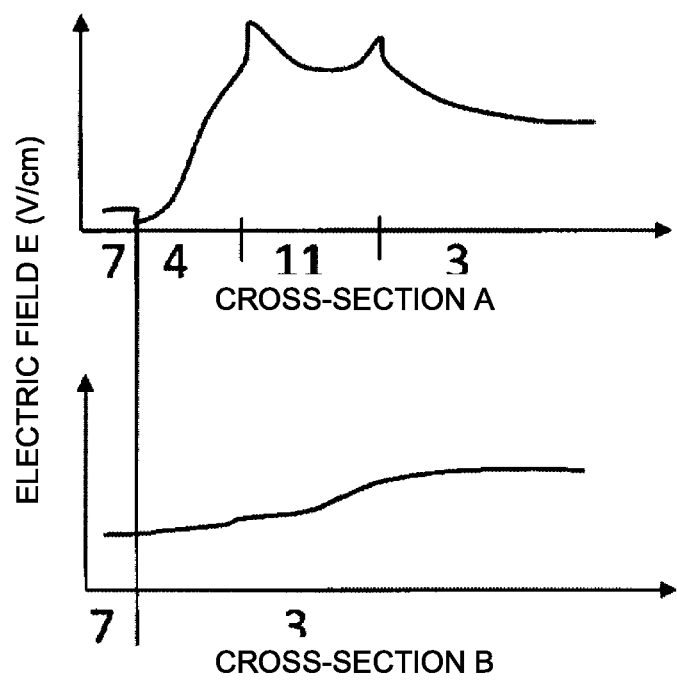
FIG. 6B shows charts illustrating electric field strength distributions in cross-section taken along line A-A and in cross-section taken along line B-B in FIG. 6A.

FIG. 6A is a view for explaining a depletion phenomenon when a high voltage is applied to the drain electrode in the semiconductor device illustrated in FIG. 1. FIG. 6B shows charts illustrating electric field strength distributions in cross-section taken along line A-A and in cross-section taken along line B-B in FIG. 6A. The horizontal axis in FIG. 6B represents position while the vertical axis represents electric field strength (V/cm). Numerals illustrated under the horizontal axis denote reference numerals illustrated in FIG. 6A. The high voltage here refers to a voltage about 80% of the withstand voltage.

When the voltage to be applied to the drain electrode 10 is further increased, the electric field is high immediately below the drain region 6 and in the isolation region 11. Although the electric field is lower immediately below the drain region 6, the amount of increase in electric field is larger.

Figure 7:
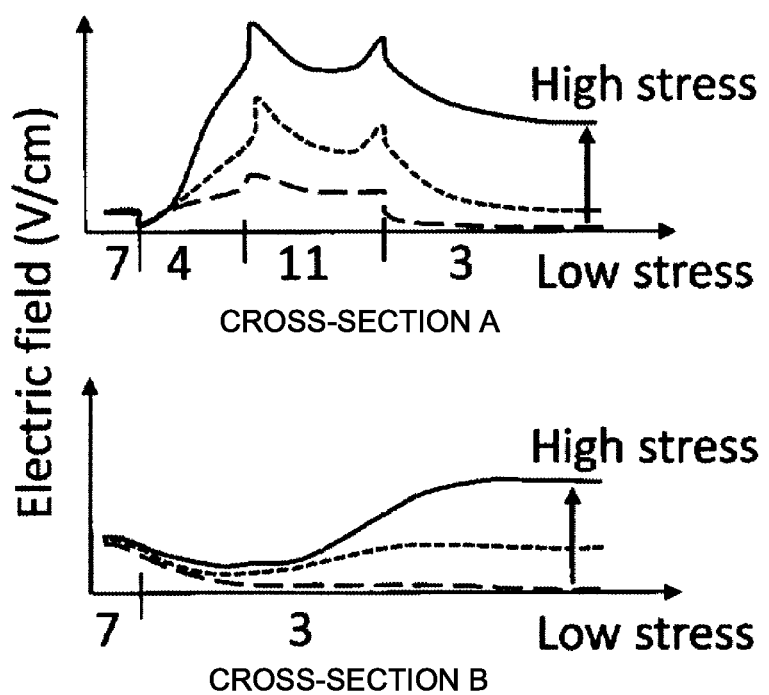
FIG. 7 is charts illustrating electric field strength distributions in cross-section taken along line A-A and in cross-section taken along line B-B using a voltage to be applied to the drain electrode as a parameter in the semiconductor device illustrated in FIG. 1.

FIG. 7 shows charts illustrating electric field strength distributions in cross-section taken along line A-A and in cross-section taken along line B-B using the voltage to be applied to the drain electrode as a parameter in the semiconductor device illustrated in FIG. 1. It is clear that the electric field strength near the isolation region 11 increases with an increase in the voltage to be applied to the drain electrode 10. A simulation (to be described later) assumes that the withstand voltage is about 720 V. The low voltage, the medium voltage, and the high voltage correspond to about 50 V, 300 V, and 600 V, respectively, in an equipotential distribution.

Figure 8:
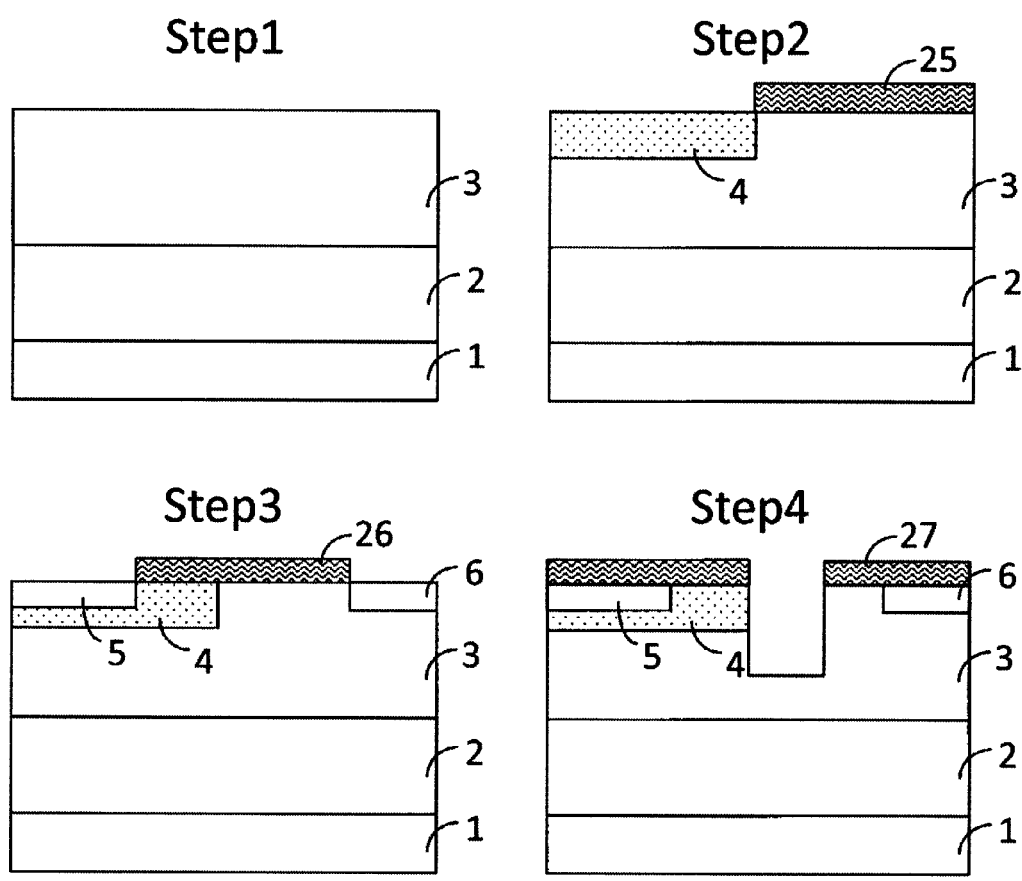
FIG. 8 shows views of a first half of a method for manufacturing the semiconductor device illustrated in FIG. 1.
Figure 9:
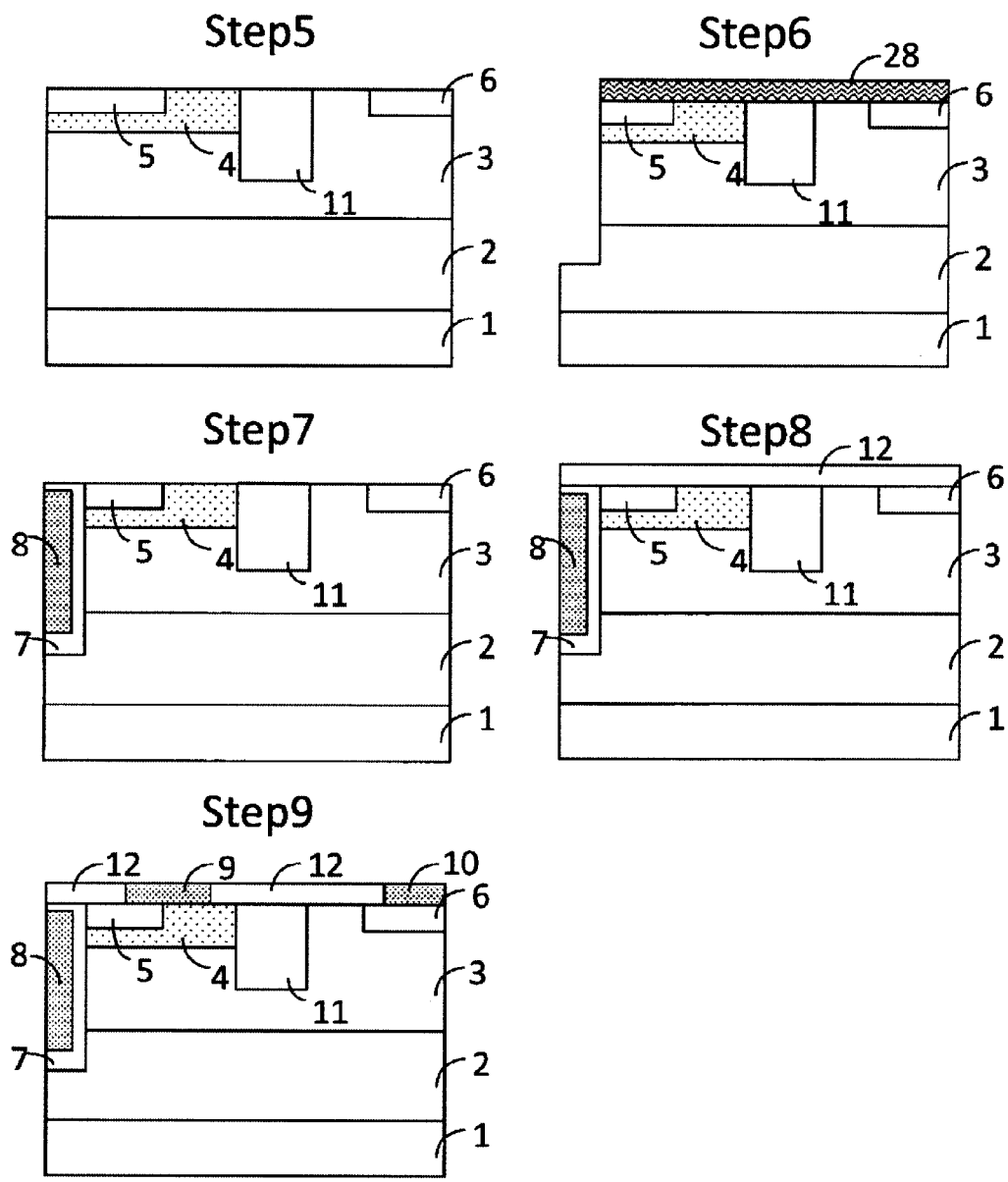
FIG. 9 shows views of a second half of the method for manufacturing the semiconductor device illustrated in FIG. 1.

Next, a method for manufacturing the semiconductor device illustrated in FIG. 1 will be described. FIG. 8 shows views of a first half of the method for manufacturing the semiconductor device illustrated in FIG. 1, and FIG. 9 shows views of a second half of the method for manufacturing the semiconductor device illustrated in FIG. 1.

In Step 1, the buffer layer 2 is formed on the substrate 1, and the semiconductor layer 3 is further formed. The method is premised on a so-called heterogeneous substrate in which the substrate 1 is different in lattice constant from the semiconductor layer 3, and heteroepitaxial growth is produced. For example, an Si substrate is used as the substrate 1, a material made of group III and group V elements, such as AlN, is deposited on the substrate 1, and GaN is grown on the material.

In Step 2, a part of a surface of the GaN is masked with a mask 25, and an impurity is mixed into an unmasked portion to form the body region 4. The impurity is mixed by ion implantation, double diffusion, selective regrowth, partial growth, or the like. If the semiconductor layer 3 is made of GaN, the body region 4 is formed by implanting an N-type impurity, such as Si or O, or a P-type impurity, such as Mg.

In Step 3, the mask used in Step 2 is removed, and a different mask 26 is provided so as to lie astride the semiconductor layer 3 and the body region 4. An impurity is mixed into the respective surface layers of the semiconductor layer 3 and the body region 4 to form the source region 5 and the drain region 6. Ion implantation, double diffusion, selective regrowth, partial growth, or the like is used. In the case of GaN, an N-type impurity, such as Si or O, is used as the impurity.

In Step 3, the source region 5 and the drain region 6 may be separately formed or may be simultaneously formed by double diffusion. The source region 5 and the drain region 6 that are contact regions are highest in impurity concentration, the body region 4 is second highest, and the semiconductor layer 3 is low.

In Step 4, a different mask 27 is provided on a surface except for a portion where the isolation region 11 is to be formed, and a part of the semiconductor layer 3 is etched. The etching may be dry etching or wet etching. Note that a hole need not be dug straight down. The hole has a trench structure.

In Step 5, the isolation region 11 is formed. A material is deposited in a region etched in Step 4. The material may be a high-dielectric material (High-K) or a low-dielectric material (SiO2). Any material may be used as long as the material is an insulating material.

In Step 6, a region where a gate is to be formed is formed by etching. A different mask 28 is formed on a surface, and deep etching is performed. The type of the etching and accuracy of dimension are not particularly limited, as in Step 4 and as with the hole at the time of the isolation region formation.

In Step 7, the gate insulating layer 7 is formed, and the gate electrode 8 is further formed. The material for the gate insulating layer 7 may be a high-dielectric material (High-K) or a low-dielectric material ($SiO_2$). Any material may be used as long as the material is an insulating material. Examples of the material for the gate electrode 8 include polysilicon and metals, for example.

In Step 8, the protective layer 12 is formed. In the case of a GaN-based semiconductor device, examples of the material for the protective layer 12 include SiN and $Al_2O_3$.

In Step 9, parts of regions where the source electrode 9 and the drain electrode 10 are to be formed of the protective layer 12 are etched, and metal layers are formed as the source electrode 9 and the drain electrode 10.

Figure 10A:
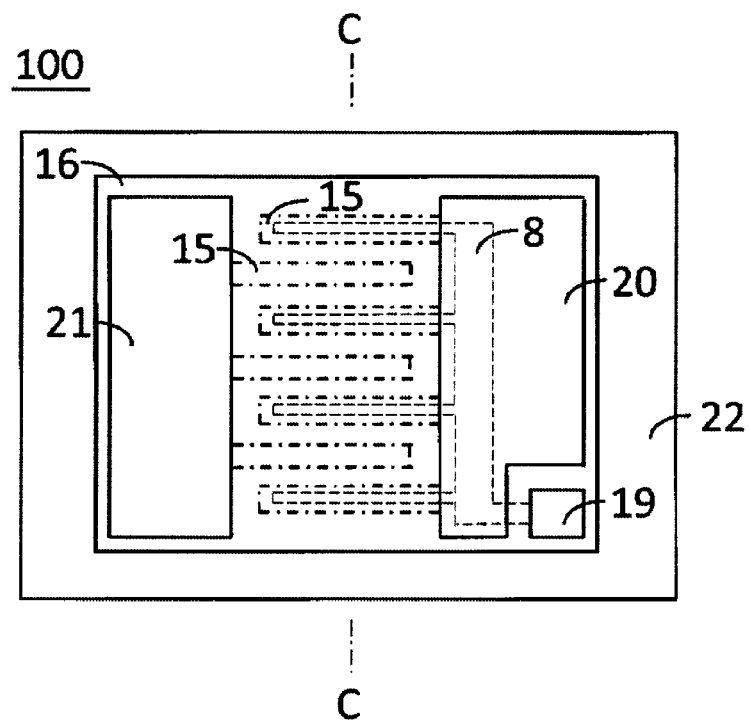
FIG. 10A is a plan view illustrating an implementation example of the semiconductor device according to the embodiment of the present invention.
Figure 10B:
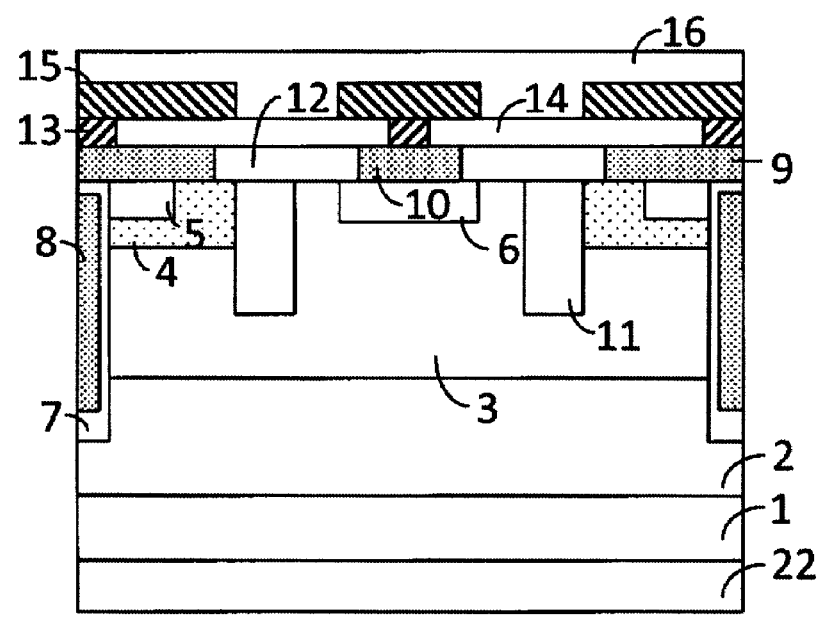
FIG. 10B is a cross-sectional view taken along line C-C in FIG. 10A.
Figure 10C:
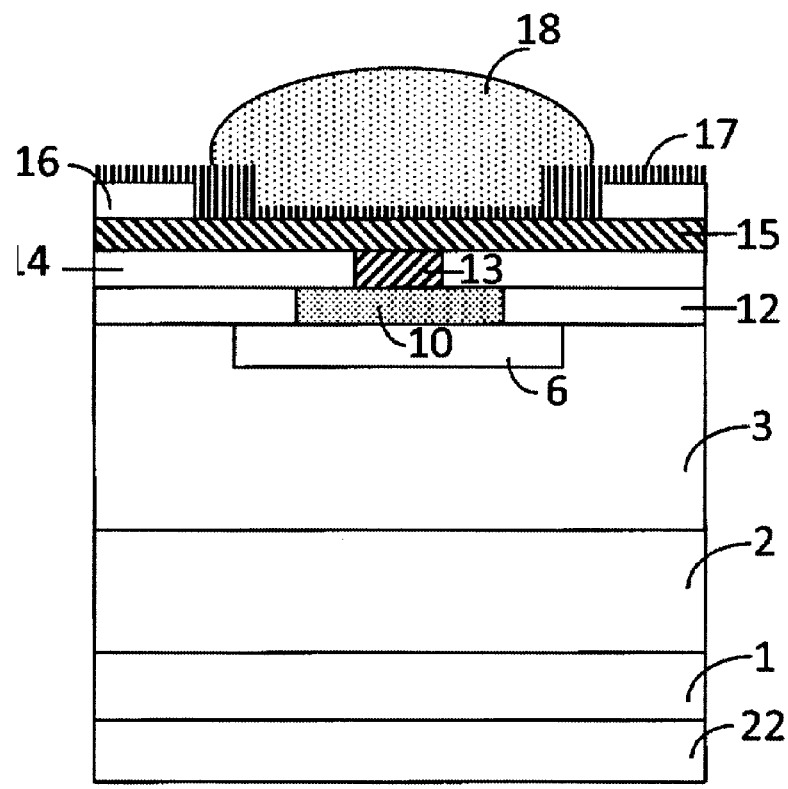
FIG. 10D is a diagram illustrating an equivalent circuit of the semiconductor device illustrated in FIG. 10A.
Figure 10D:
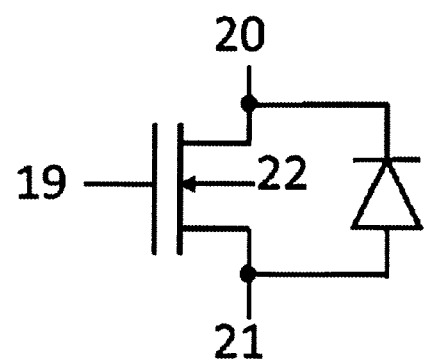

Next, an implementation example of the semiconductor device according to the embodiment of the present invention will be described. FIG. 10A is a plan view illustrating the implementation example of the semiconductor device according to the embodiment of the present invention. FIG. 10B is a cross-sectional view taken along line C-C in FIG. 10A. FIG. 10C is an example of implementation to an external terminal in the semiconductor device illustrated in FIG. 10A. FIG. 10D is a diagram illustrating an equivalent circuit of the semiconductor device illustrated in FIG. 10A.

As illustrated in FIG. 10A, in the semiconductor device 100, metal layers 15 and 15 which extend from a source terminal 20 and a drain terminal 21 like comb teeth respectively and the gate electrodes 8 that extend from a gate terminal 19 form devices in a plurality of regions. In FIG. 10A, reference numeral 22 denotes a substrate terminal which is formed on a back surface of the substrate 1. The semiconductor device 100 illustrated in FIG. 10B is called a "cell transistor".

FIG. 10B shows a cross-section in a vertical direction between the source terminal 20 and the drain terminal 21 in FIG. 10A and is the same in basic configuration as FIG. 1. Contact layers 13 and 13 are formed on the source electrodes 9 and the drain electrode 10, and interlaminar insulating layers 14 are formed between the contact layers 13 and 13 above the protective layer 12. The metal layer 15 is formed on each contact layer 13, and an insulating layer 16 is formed between the metal layers 15 and on the metal layers 15.

As can be seen from FIG. 10B, the total number of metal wiring layers can be reduced due to the absence of a field plate, as compared with the related art. This results in achievement of miniaturization, simplification of process procedures, and a size reduction.

To use the semiconductor device illustrated in FIG. 10A as an individual semiconductor, the substrate terminal 22 at the back surface of the substrate 1 is connected to the source electrode 9 and is grounded. A part of the insulating layer 16 illustrated in FIG. 10B is removed, a metal layer 17 is provided on the metal layer 15 and the insulating layer 16 at a portion, from which the part of the insulating layer 16 is removed, and solder 18 is provided, as illustrated in FIG. 10O. With this configuration, the semiconductor device is led out to an external terminal.

Figure 11A:
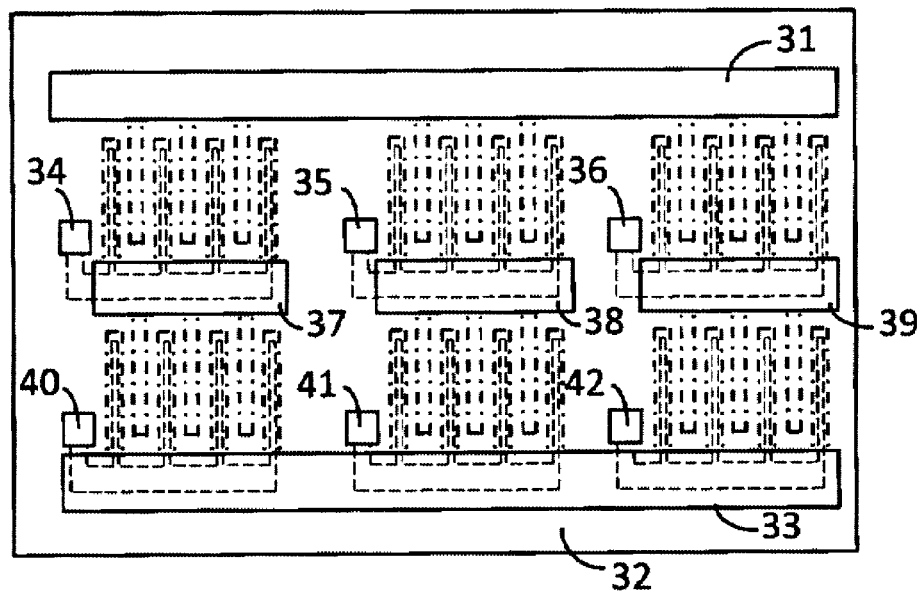
FIG. 11A is a plan view of an integrated semiconductor device according to the embodiment of the present invention.
Figure 11B:
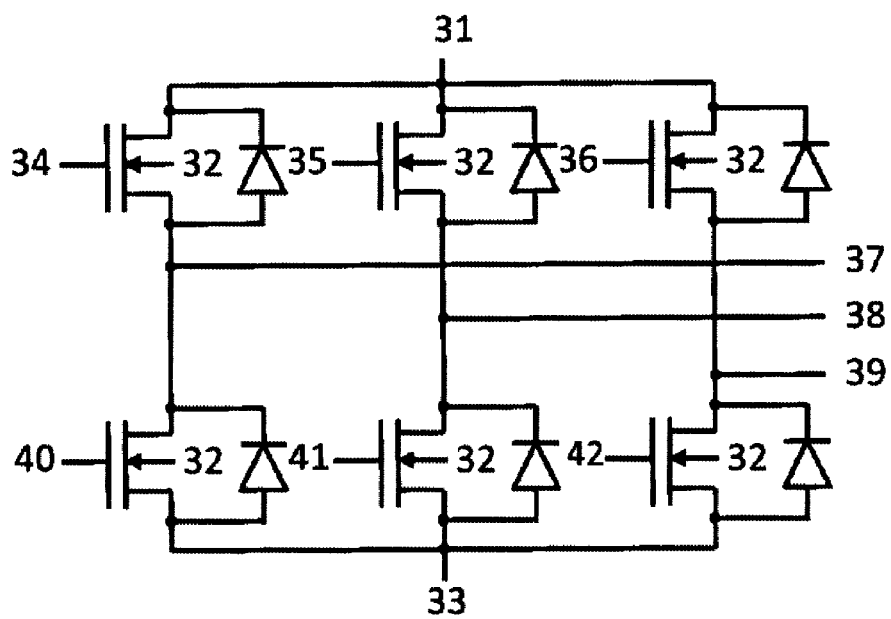
FIG. 11B shows an equivalent circuit of the integrated semiconductor device illustrated in FIG. 11A.

FIG. 11A is a plan view of an integrated semiconductor device according to the embodiment of the present invention, and FIG. 11B is an equivalent circuit of the integrated semiconductor device illustrated in FIG. 11A. An integrated semiconductor device 200 is provided with a total of six (2×3) semiconductor devices, as illustrated in FIGS. 11A and 11B.

The integrated semiconductor device 200 is obtained by implementing a plurality of devices on a same substrate and is used incorporated in, for example, a three-phase inverter circuit. In plan view, a power line 31 is commonly connected to three upper devices (high-side devices), and a GND line 33 is commonly connected to three lower devices (low-side devices). Between the three upper devices and the three lower devices, a first output terminal 37, a second output terminal 38, and a third output terminal 39 are arranged from left to right. A first gate terminal 34, a second gate terminal 35, and a third gate terminal 36 are provided in corners of the upper devices, and a fourth gate terminal 40, a fifth gate terminal 41, and a sixth gate terminal 42 are provided in corners of the lower devices.

The integrated semiconductor device 200 (hereinafter simply referred to as a "device") illustrated in FIG. 11A is constructed by arranging a plurality of semiconductor devices 100 illustrated in FIG. 10A, each regarded as a unit, on a same substrate 1. In the device 200, one given unit has the outside gate insulating layer 7 with respect to each of different units adjacent in two directions. Thus, the semiconductor devices 100 are separated by the outside gate insulating layers 7 on a per-unit basis. For example, a transistor group having the first gate terminal 34 and a transistor group having the second gate terminal 35 are separated by the gate insulating layer 7. The transistor group having the first gate terminal 34 and a transistor group having the fourth gate terminal 40 are separated by the gate insulating layer 7.

A conventional case where a plurality of transistor groups are provided on a same substrate requires a process, such as ion implantation, to separate the transistor groups. The device 200 according to the embodiment of the present invention does not require the process and can be reduced in size.

To ground the substrate 32 in the above-described type of integration, a diode needs to be formed at the substrate 32. To set a potential of the substrate 32 to GND, the design needs to be changed such that substrate potentials of high-side transistors (transistors having the first to third gate terminals 34, 35, and 36) are equal to potentials of the output terminals 37, 38, and 39.

Figure 12A:
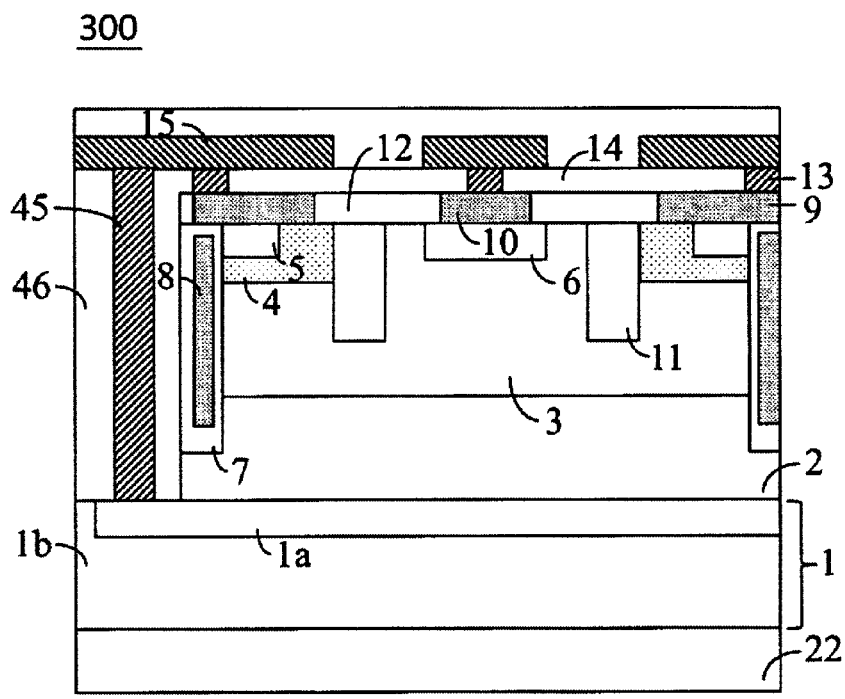
FIG. 12A is a plan view of an integrated semiconductor device according to the embodiment of the present invention.
Figure 12B:
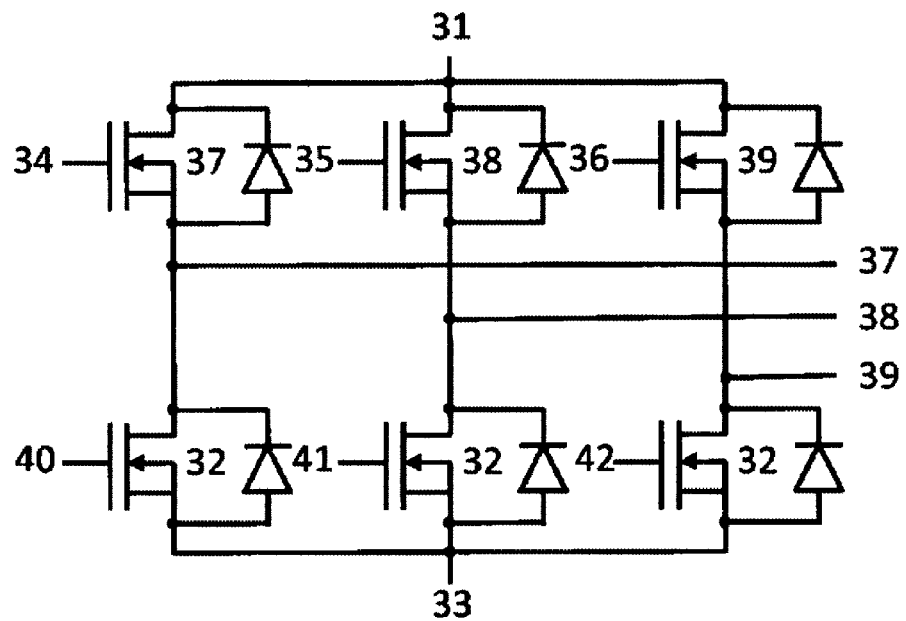
FIG. 12B shows an equivalent circuit of the integrated semiconductor device illustrated in FIG. 12A.

FIG. 12A is a cross-sectional view of an integrated semiconductor device in which a diode is formed at a substrate. FIG. 12B shows an equivalent circuit of the integrated device when FIG. 12A is used. Note that a plan view is the same as illustrated in FIG. 11A.

An integrated semiconductor device 300 uses, as the substrate 1, a substrate having an n-type semiconductor region 1a on a p-type semiconductor region 1b to secure substrate potentials among transistors integrated on the same substrate 1. The n-type semiconductor region 1a formed on a surface of the substrate 1 and a source electrode composed of the metal layer 15 are connected via a metal via 45. With this configuration, source potentials for respective high-side transistors can be given as apparent substrate potentials to the transistors. Note that a source potential is common to all low-side transistors and such a substrate and such a metal via need not be provided. An insulating layer 46 is formed around the metal via 45.

Figure 13:
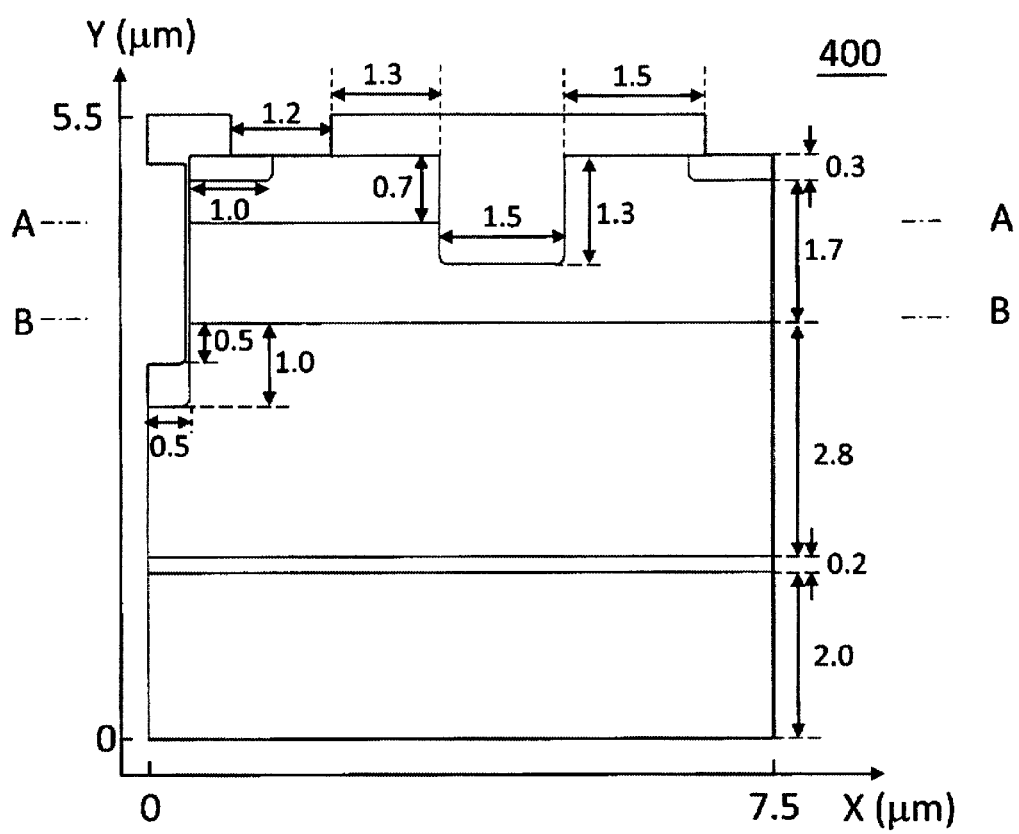
FIG. 13 is a chart illustrating a cross-sectional structure used in a simulation.

A simulation about a semiconductor device according to the embodiment of the present invention will be described. The simulation was performed with physical models including a mobility model, a recombination model, and a tunnel model in mind. Sentauraus TCAD2013.03 from Synopsys Ins. was used as simulation software. A structure of the semiconductor device according to the embodiment of the present invention was simplified, as illustrated in FIG. 13, and dimensions of the semiconductor device were set. Si was set as the material for the substrate 1 for semiconductor growth, the material for the buffer layer 2 was set to Al and GaN, the materials for the semiconductor layer 3, the body region 4, the source region 5, and the drain region 6 were set to GaN, and the materials for the gate insulating layer 7, the isolation region 11, and the protective layer 12 were set to SiN. Note that a work function of the gate electrode 8 was set to 4.0 eV and that the source electrode 9 and the drain electrode 10 were both set to ideal contact states. An acceptor type trap was set as an electron trap site in the buffer layer 2.

Figure 14A:
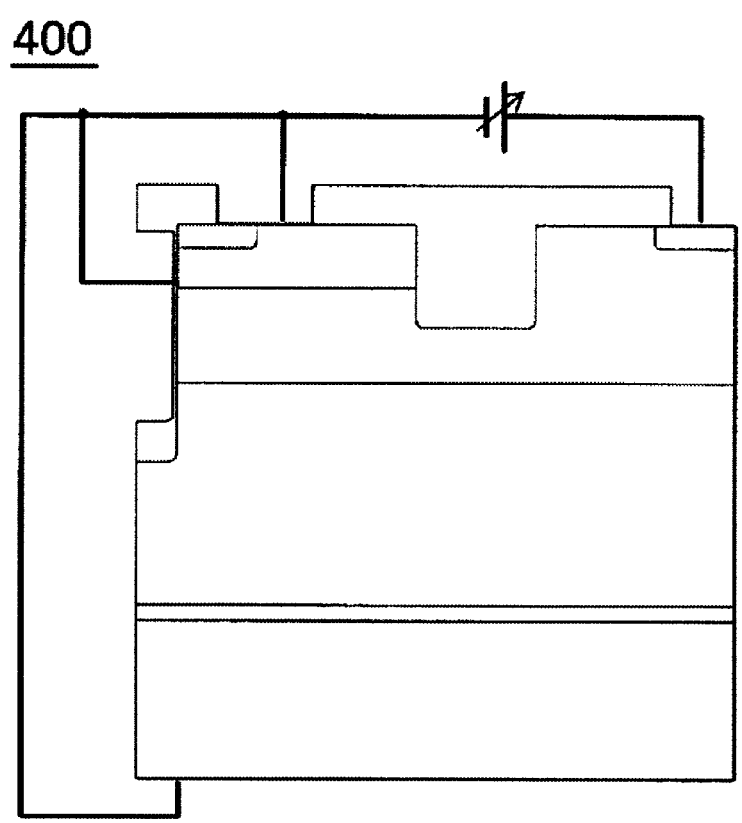
FIG. 14A is a chart illustrating a first condition for the simulation.
Figure 14B:
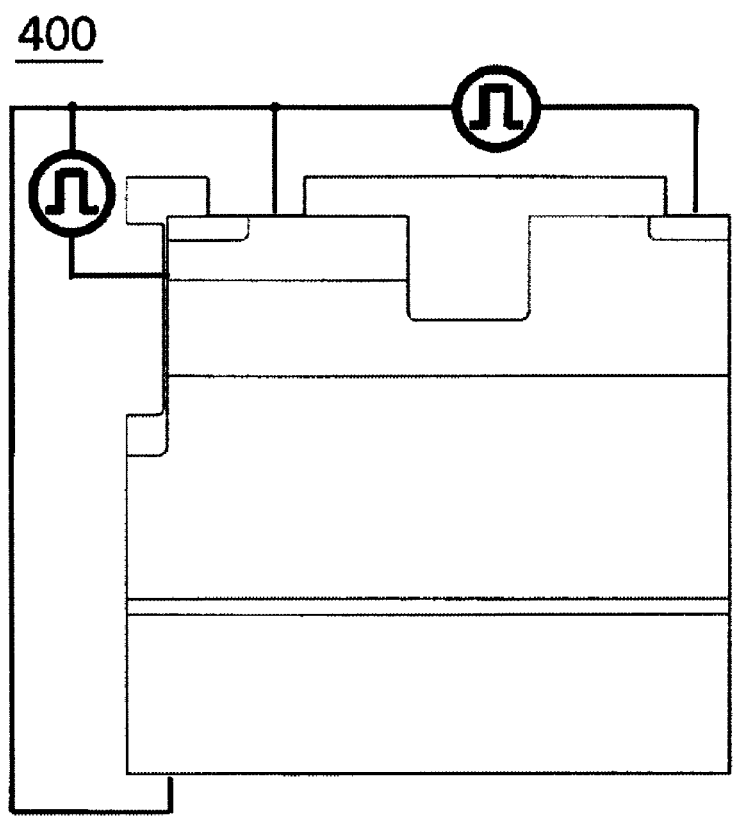
FIG. 14B is a chart illustrating a second condition for the simulation.

A stress voltage was applied between drain and source, and an electric field distribution characteristic and a switching characteristic were obtained. FIG. 14A is a chart illustrating a first condition for the simulation, and the first condition is that the substrate 1, the gate electrode 8, and the source electrode 9 are connected together to be at a same potential, and a voltage is applied between the drain electrode 10 and the source electrode 9. FIG. 14B is a chart illustrating a second condition for the simulation. The second condition is that the substrate 1 and the source electrode 9 are connected together to be at a same potential, a pulse voltage is applied to the gate electrode 8, and a pulse voltage is applied between the drain electrode 10 and the source electrode 9.

Figure 15A:
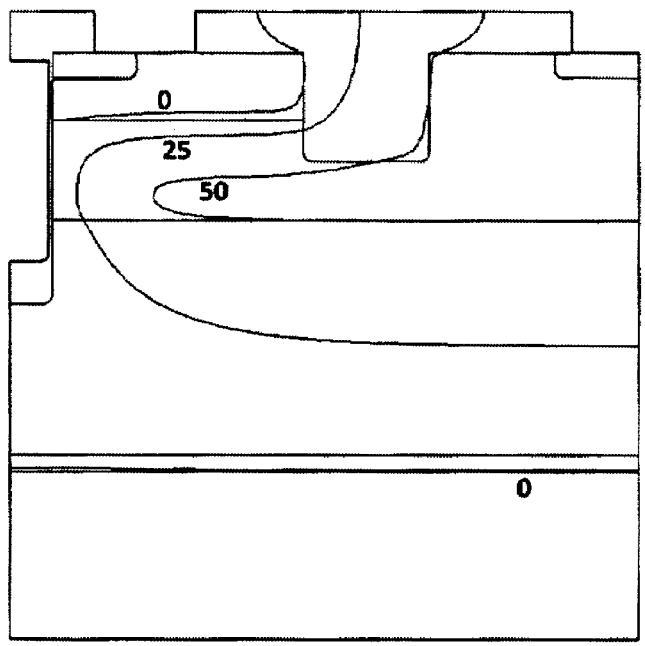
FIG. 15A relates to results of the first simulation and illustrates an equipotential line distribution when a direct current at 50 V was applied to a drain electrode.
Figure 15B:
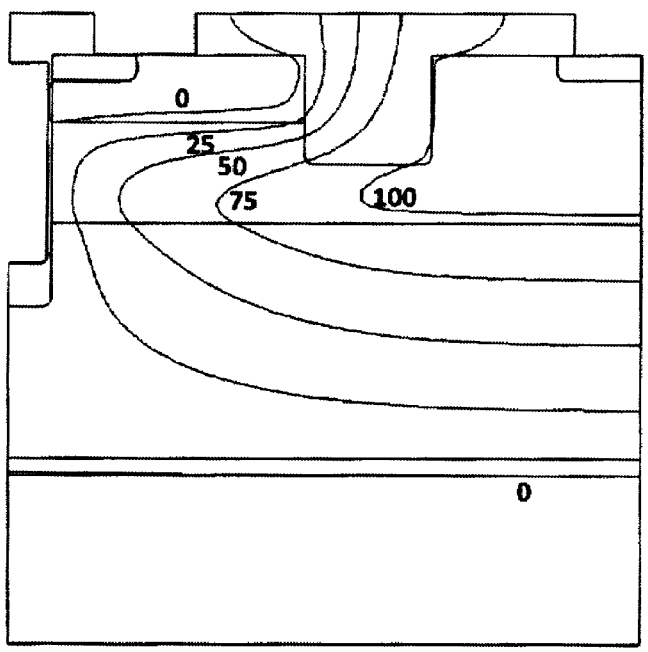
FIG. 15B relates to the results of the first simulation and is a chart illustrating an equipotential line distribution when a direct current at 100 V was applied to the drain electrode.
Figure 15C:
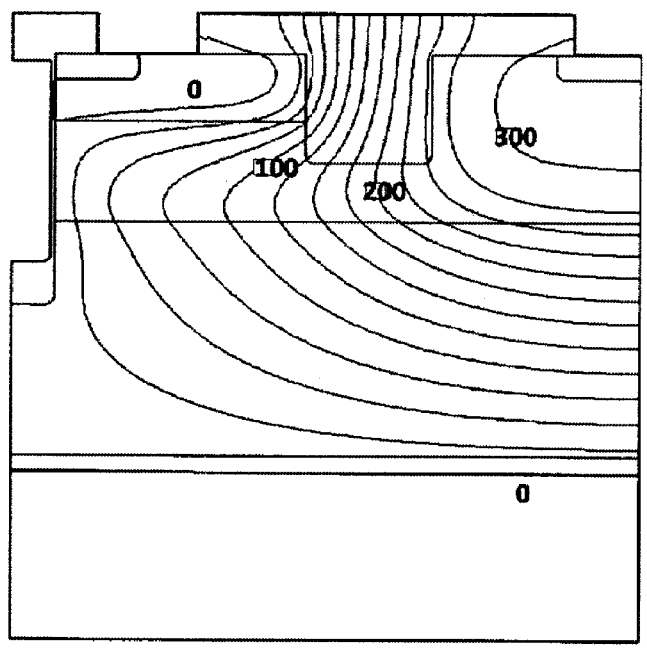
FIG. 15C relates to the results of the first simulation and is a chart illustrating an equipotential line distribution when a direct current at 300 V was applied to the drain electrode.
Figure 15D:
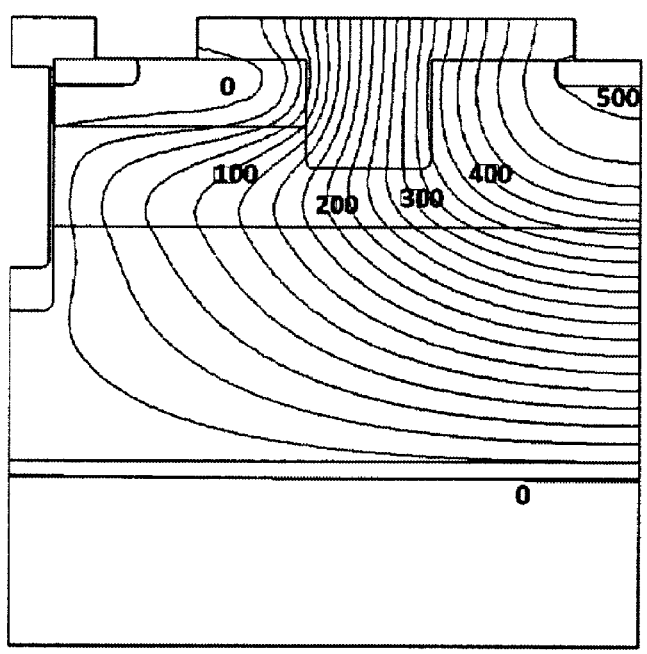
FIG. 15D relates to the results of the first simulation and is a chart illustrating an equipotential line distribution when a direct current at 500 V was applied to the drain electrode.
Figure 15E:
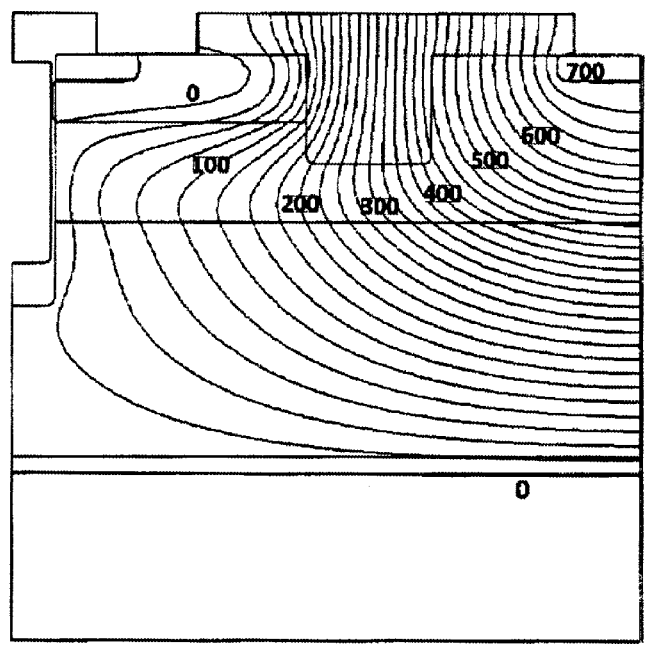
FIG. 15E relates to the results of the first simulation and is a chart illustrating an equipotential line distribution when a direct current at 700 V was applied to the drain electrode.

FIGS. 15A to 15E are charts illustrating results of the first simulation. FIG. 15A illustrates an equipotential line distribution when a direct current at 50 V was applied to the drain electrode, FIG. 15B illustrates an equipotential line distribution when a direct current at 100 V was applied to the drain electrode, FIG. 15C illustrates an equipotential line distribution when a direct current at 300 V was applied to the drain electrode, FIG. 15D illustrates an equipotential line distribution when a direct current at 500 V was applied to the drain electrode, and FIG. 15E is a chart illustrating an equipotential line distribution when a direct current at 700 V was applied to the drain electrode. Note that a step size for potential lines is shown to be 25 V and that electric field strength (MV/cm) is obtained by the potential line step size (MV)/the interval between potential lines (cm).

It was found from FIGS. 15A to 15E that the electric field was uniformly distributed all over the semiconductor layer 3 and that an increase in the withstand voltage was achieved due to the absence of electric field concentration.

Figure 16A:
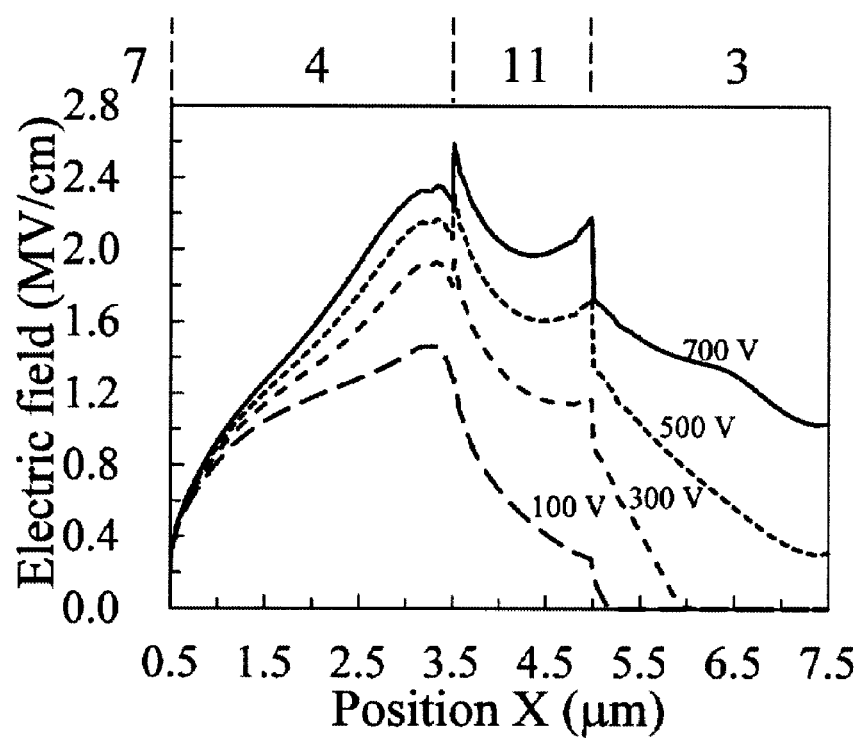
FIG. 16A relates to the results of the first simulation and is a graph illustrating electric field distributions in cross-section A-A.
Figure 16B:
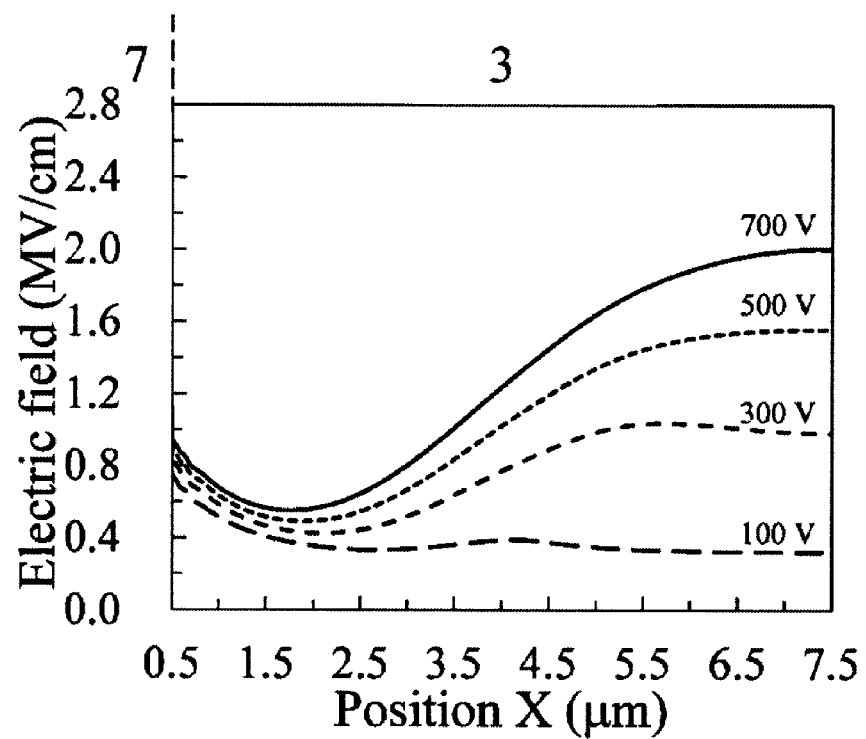
FIG. 16B relates to the results of the first simulation and is a graph illustrating electric field distributions in cross-section B-B.

FIGS. 16A and 16B are graphs illustrating results of the first simulation. FIG. 16A shows electric field distributions in cross-section A-A, and FIG. 16B shows electric field distributions in cross-section B-B. Note that numerals above the upper horizontal axis in each figure denote components for ones of the reference numerals described earlier.

Electric field distribution strengths as described with reference to FIGS. 4A to 6B were obtained from these figures.

Figure 17A:
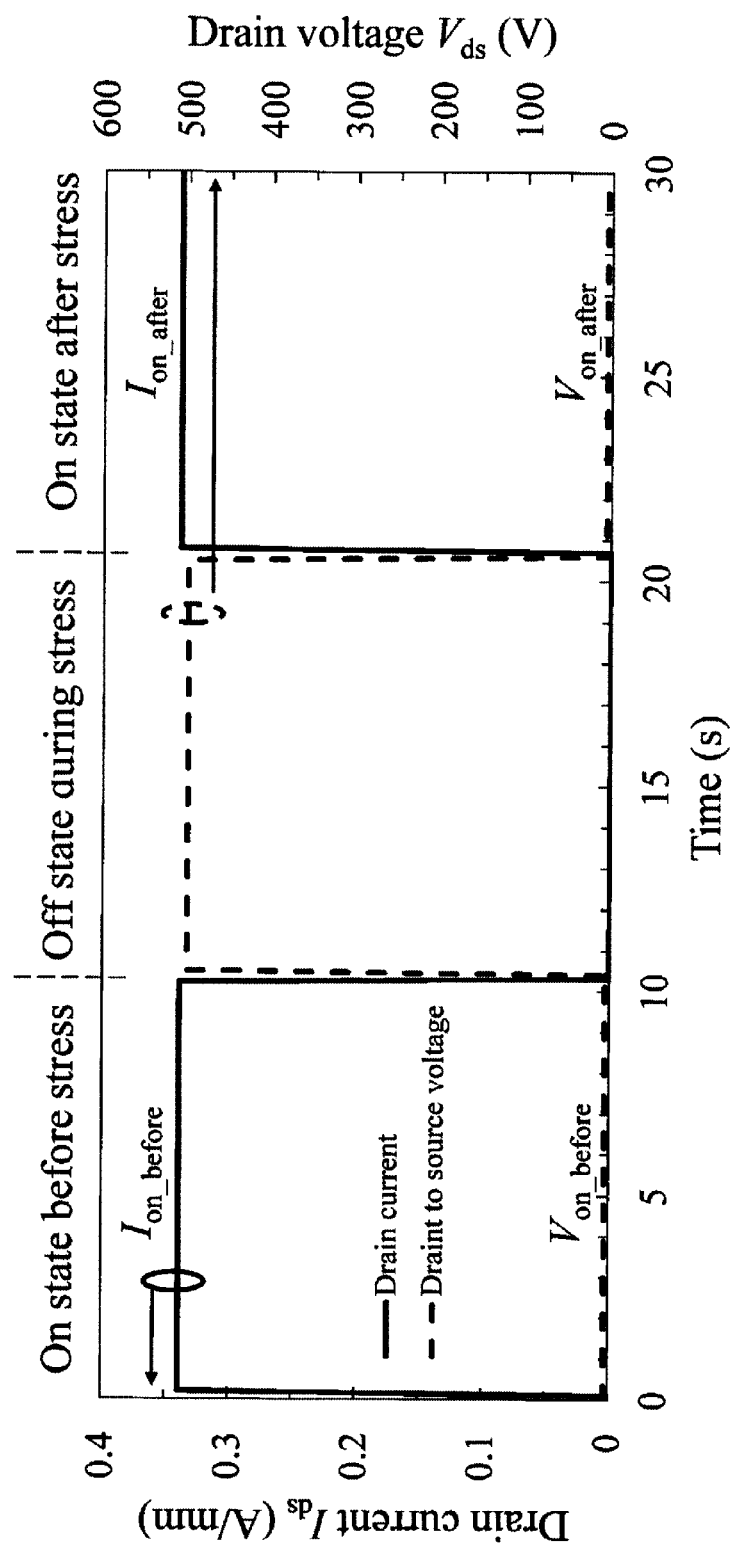
FIG. 17A relates to results of the second simulation and is a graph illustrating switching characteristics.
Figure 17B:
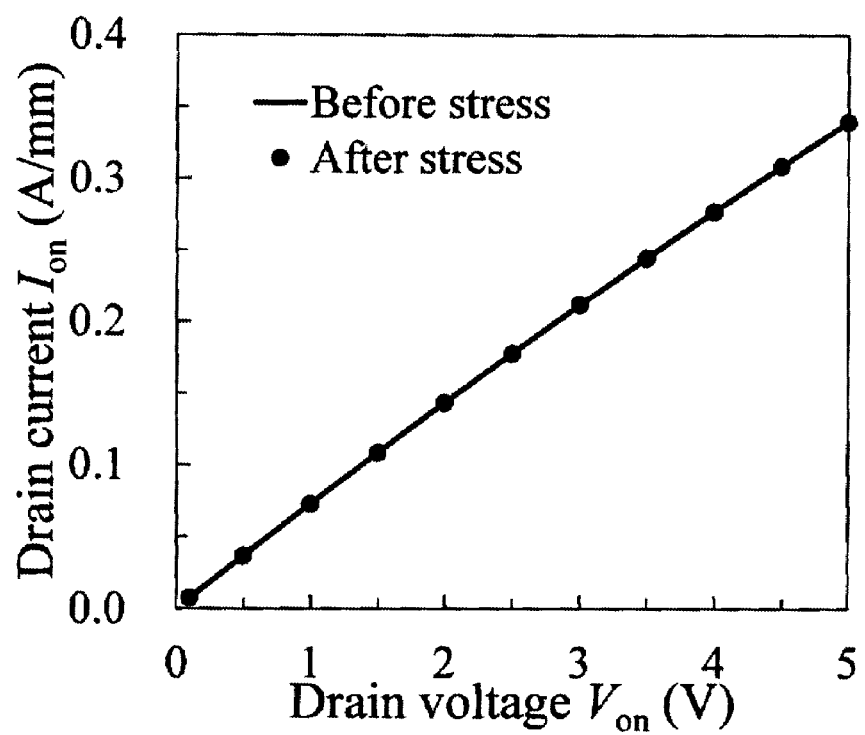
FIG. 17B relates to the results of the second simulation and is a graph illustrating a characteristic of drain current with respect to drain voltage before and after stress.
Figure 18:
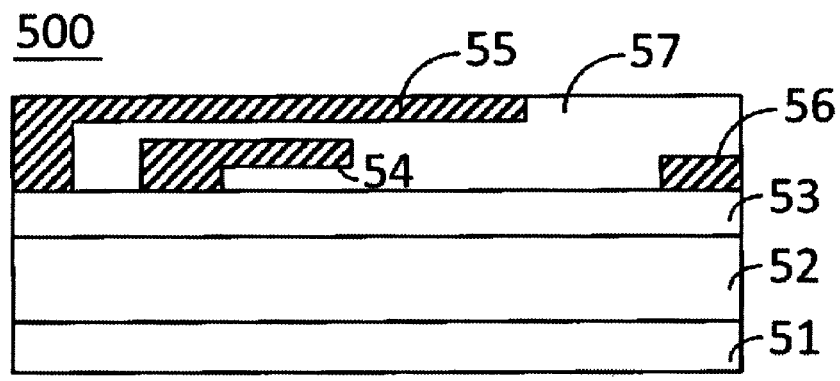
FIG. 18 is a cross-sectional view of a conventional nitride semiconductor device.
Figure 19:
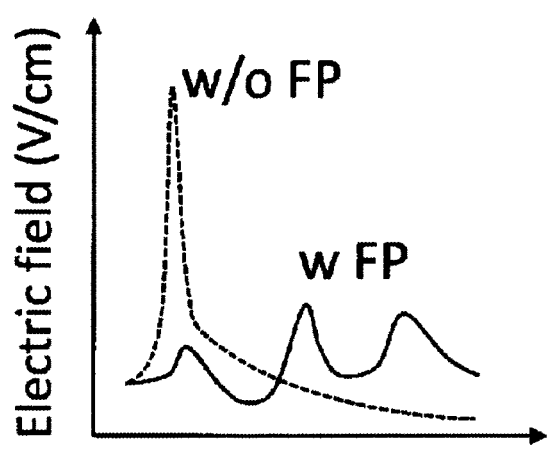
FIG. 19 is a graph illustrating an electric field strength distribution of the nitride semiconductor device illustrated in FIG. 18.

FIGS. 17A and 17B relate to results of the second simulation and are graphs illustrating switching characteristics. FIG. 17A shows a result as switch characteristics. The horizontal axis represents time, the left vertical axis represents drain current density, and the right vertical axis represents drain voltage. A solid line indicates a drain current density while a dotted line indicates a drain to source voltage. It was found from FIG. 17A that a drain current and the drain voltage remained unchanged even after switching.

FIG. 17B shows a result as a switching characteristic, and the switching characteristic is a characteristic of the drain current with respect to the drain voltage. It was found from FIG. 17B that the drain current was proportional to the drain voltage, regardless of the presence or absence of voltage application, and that the trend remained unchanged between before and after stress.

It was found from the results in FIGS. 17A and 17B that no current collapse phenomenon occurred.

An inter-electrode distance (a distance between the gate electrode and the drain electrode) for a breakdown voltage was obtained and compared with a theoretical limit value. It was confirmed that the inter-electrode distance was larger only by 530 nm for the breakdown voltage of 900 V. In the structure illustrated in FIG. 13, the inter-electrode distance is 690 nm/100 V and is smaller than an inter-electrode distance of 938 to 1667 nm/100 V in a conventional HEMT. It was found that cell dimensions of the semiconductor device could be reduced.

It was confirmed that the reduction in cell dimensions achieved a reduction of 20% or more in loss and an increase of about 16% in current, as compared with an ideal HEMT structure.

According to the above-described embodiment of the present invention, an increase in withstand voltage and an increase in current can be achieved in a nitride-based semiconductor device.

The embodiment of the present invention has been described above. The embodiment of the present invention, to which an appropriate change has been made, is also included in the scope of the present invention illustrated in the scope of the claims.

The material for the semiconductor layer 3 may be a III-V semiconductor, a IV-IV semiconductor, or a II-VI semiconductor. III-V semiconductors include GaN, AlGaN, InGaN, InP, GaAs, and AlN. IV-IV semiconductors include SiC, diamond, and Ge. The material for the buffer layer 2 is appropriately selected in accordance with the type of the semiconductor layer 3. The isolation region 11 and the protective layer 12 may be integrated together by using the same type of material.

REFERENCE SIGNS LIST 100, 200, 300: semiconductor device
1: substrate (substrate for semiconductor growth)
1a: n-type semiconductor region
1b: p-type semiconductor region
2: buffer layer
3: semiconductor layer
4: body region
5: source region
6: drain region
7: gate insulating layer
8: gate electrode
9: source electrode
10: drain electrode
11: isolation region
12: protective layer
13: contact layer
14: interlaminar insulating layer
15, 17: metal layer
16: insulating layer
18: solder pad
19: gate terminal
20: source terminal
21: drain terminal
22: substrate terminal
25, 26, 27, 28: mask
31: power line
32: substrate
33: GND line
34: first gate terminal
35: second gate terminal
36: third gate terminal
37: first output terminal
38: second output terminal
39: third output terminal
40: fourth gate terminal
41: fifth gate terminal
42: sixth gate terminal
45: metal via
46: insulating layer

The invention claimed is:
1. A semiconductor device comprising:
a substrate;
a buffer layer provided on the substrate;
a semiconductor layer provided on the buffer layer, the buffer layer facilitating a matching of a lattice constant of the substrate to a lattice constant of the semiconductor layer;
a body region provided at a part of a surface layer of the semiconductor layer;
a source region provided at a part of a surface layer of the body region;
a drain region provided at a part of the surface layer of the semiconductor layer and spaced apart from the body region;

a gate insulating layer provided to extend from the surface layer of the semiconductor layer to a first predetermined depth within the semiconductor device;
a gate electrode provided on the gate insulating layer;
a source electrode provided on the source region;
a drain electrode provided on the drain region; and
an isolation region provided to extend from the surface layer of the semiconductor layer to a second predetermined depth within the semiconductor device, the isolation region (i) located between the body region and the drain region and (ii) spaced apart from the drain region with the semiconductor layer residing between the isolation region and the drain region;
wherein the gate electrode comprises a top portion that is aligned in a first direction with at least a portion of the source region, a middle portion that extends in a second direction from the top portion through the semiconductor layer, and a lower portion that extends in the second direction into the buffer layer, the second direction being a channel-formed direction within the semiconductor device; and
wherein the gate electrode is spaced apart from the buffer layer exclusively by two perpendicular faces of the gate insulating layer.

2. The semiconductor device according to claim 1, wherein the gate electrode is formed to extend from the source region to a third predetermined depth within the semiconductor device such that the gate electrode reaches the semiconductor layer.

3. The semiconductor device according to claim 1, wherein the isolation region is formed to extend from the surface layer of the semiconductor layer to a depth deeper than the body region and not to reach the buffer layer.

4. The semiconductor device according to claim 1, wherein the buffer layer is insulating or semi-insulating.

5. The semiconductor device according to claim 1, wherein the semiconductor layer contains an impurity of N-type or P-type and is electroconductive.

6. The semiconductor device according to claim 1, wherein the semiconductor layer and the body region constitute a diode, and the diode blocks a reverse current from flowing easily when a reverse bias is applied between the drain electrode and the source electrode.

7. The semiconductor device according to claim 1, wherein the body region has a carrier density higher than a carrier density of the semiconductor layer.

8. The semiconductor device according to claim 1, wherein the semiconductor layer, the body region, and the source region constitute an NPN or a PNP.

9. The semiconductor device according to claim 1, wherein the gate insulating layer is adjacent to the source region and the body region and is not provided between the body region and the drain region.

10. The semiconductor device according to claim 1, wherein the source region and the drain region have carrier densities higher than the carrier density of the semiconductor layer.

11. The semiconductor device according to claim 1, wherein when a voltage is applied to the gate electrode such that an inversion layer is formed in the body region, a current path is formed to extend from the drain electrode, to a region below the isolation region of the semiconductor layer, then to the body region, and then to the source electrode.

12. The semiconductor device according to claim 1, wherein the substrate, the buffer layer, and the semiconductor layer block a reverse current from flowing when a reverse bias is applied between the drain electrode and the substrate.

13. The semiconductor device according to claim 1, wherein the body region, the gate electrode, the source region, and the drain region constitute a transistor,
wherein a plurality of the gate insulating layers are iteratively provided in a plurality of regions, and the body region, the source region, and the drain electrode are respectively provided between each adjacent two of the gate insulating layers, and
wherein the gate insulating layer and the buffer layer isolate the transistor, the transistor being adjacent.

14. An integrated device comprising a plurality of semiconductor devices according to claim 13 arranged on a semiconductor device basis, wherein the plurality of semiconductor devices are separated by the gate insulating layer on a per-unit basis.

15. The semiconductor device according to claim 1, wherein the isolation region is located adjacent to the body region, spaced apart from the drain region in a first direction via the semiconductor layer, and spaced apart from the buffer layer in a second direction via the semiconductor layer, the second direction being perpendicular to the first direction.

16. The semiconductor device according to claim 1, wherein the drain region is spaced apart from the body region in a first direction, and spaced apart from the buffer layer in a second direction perpendicular to the first direction.

17. The semiconductor device according to claim 1, wherein the drain region extends from the surface layer of the semiconductor layer to a third predetermined depth within the semiconductor device, the third predetermined depth being less than the second predetermined depth.

18. The semiconductor device according to claim 1, wherein the buffer layer includes GaN or AlGaN.

19. The semiconductor device according to claim 1, wherein the source electrode is provided on and extends between the source region and the body region.

20. The semiconductor device according to claim 1, wherein the source region is spaced apart from the isolation region by the body region.

21. The semiconductor device according to claim 1, wherein the drain region is in direct contact with the semiconductor layer.

22. The semiconductor device according to claim 1, wherein the source electrode is provided on and extends between the source region and the body region, the source region is spaced apart from the isolation region by the body region, and the drain region is in direct contact with the semiconductor layer.

23. A semiconductor device comprising:
a substrate;
a buffer layer provided on the substrate and comprising GaN or AlGaN;
a semiconductor layer provided on the buffer layer, the buffer layer facilitating a matching of a lattice constant of the substrate to a lattice constant of the semiconductor layer;
a body region provided at a part of a surface layer of the semiconductor layer;
a source region provided at a part of a surface layer of the body region;
a drain region provided at a part of the surface layer of the semiconductor layer and spaced apart from the body region;
a gate insulating layer provided to extend from the surface layer of the semiconductor layer to a first predetermined depth within the semiconductor device;

a gate electrode provided on the gate insulating layer;
a source electrode provided on the source region;
a drain electrode provided on the drain region; and
an isolation region provided to extend from the surface layer of the semiconductor layer to a second predetermined depth within the semiconductor device, the isolation region located between the body region and the drain region;
wherein the drain region extends from the surface layer of the semiconductor layer to a third predetermined depth within the semiconductor device, the third predetermined depth being less than the second predetermined depth;
wherein the gate insulating layer and the gate electrode have elongate lengths that extend in a channel-forming direction within the semiconductor device, each of two perpendicular surfaces of the gate insulating layer is in direct contact with the buffer layer, and a bottom of the gate electrode reaches inside the buffer layer and is spaced apart from the buffer layer exclusively by the two perpudicular surfaces of the gate insulating layer.

24. The semiconductor device according to claim 23, wherein the gate electrode is formed to extend from the source region to a fourth predetermined depth within the semiconductor device, the fourth predetermined depth being more than the second predetermined depth.

\* \* \* \* \*